US009769412B2

(12) United States Patent
Nashida et al.

(10) Patent No.: US 9,769,412 B2
(45) Date of Patent: Sep. 19, 2017

(54) REMOTE CONTROLLER AND SYSTEM HAVING THE SAME

(71) Applicant: SONY CORPORATION, Tokyo (JP)

(72) Inventors: Tatsushi Nashida, Kanagawa (JP); Kunihito Sawai, Kanagawa (JP)

(73) Assignee: Sony Corporation, Tokyo (JP)

( * ) Notice: Subject to any disclaimer, the term of this patent is extended or adjusted under 35 U.S.C. 154(b) by 358 days.

(21) Appl. No.: 14/259,643

(22) Filed: Apr. 23, 2014

(65) Prior Publication Data

US 2014/0232943 A1  Aug. 21, 2014

Related U.S. Application Data

(63) Continuation of application No. 11/717,439, filed on Mar. 12, 2007, which is a continuation of application (Continued)

(30) Foreign Application Priority Data

Jul. 12, 2001 (JP) ................. 2001-211854
Jul. 16, 2001 (JP) ................. 2001-215188

(51) Int. Cl.
*G06F 21/00* (2013.01)
*H04N 5/44* (2011.01)
(Continued)

(52) U.S. Cl.
CPC ......... *H04N 5/4403* (2013.01); *H03J 1/0025* (2013.01); *H04N 21/4122* (2013.01);
(Continued)

(58) Field of Classification Search
CPC ..... H04L 9/0891; H04L 9/3249; H04L 9/302; H04N 5/4403; H04N 2005/4408; H03J 1/0025
(Continued)

(56) References Cited

U.S. PATENT DOCUMENTS 5,021,976 A   6/1991  Wexelblat et al.
5,031,046 A   7/1991  Bruggemann
(Continued)

FOREIGN PATENT DOCUMENTS

EP   0967797      12/1999
JP   01-265696    10/1989
(Continued)

OTHER PUBLICATIONS

Feb. 11, 2016, Extended European Search Report for related EP Application No. 14002579.2.

*Primary Examiner* — David Garcia Cervetti
(74) *Attorney, Agent, or Firm* — Paratus Law Group, PLLC

(57) ABSTRACT

In order to provide a remote control system that is easy to use, a first displaying unit displays a remote controller side display information. Since a first operation unit is used to select the remote controller side display information and then drag towards an image display apparatus, a display position of the remote controller side display information on the display surface of the first displaying unit is visually moved towards an image display apparatus. In accordance with the movement operation of the remote controller side display information, operational information associated with the remote controller side display information is transmitted from a first communicator to a second communicator.

22 Claims, 17 Drawing Sheets

Related U.S. Application Data

No. 10/192,268, filed on Jul. 10, 2002, now Pat. No. 7,190,345.

(51) Int. Cl.

| | |
|---|---|
| *H03J 1/00* | (2006.01) |
| *H04N 21/41* | (2011.01) |
| *H04N 21/422* | (2011.01) |
| *H04N 21/436* | (2011.01) |
| *H04N 21/472* | (2011.01) |
| *H04N 21/4782* | (2011.01) |
| *H04N 21/482* | (2011.01) |

(52) U.S. Cl.
CPC ... *H04N 21/4126* (2013.01); *H04N 21/42207* (2013.01); *H04N 21/42209* (2013.01); *H04N 21/42222* (2013.01); *H04N 21/42224* (2013.01); *H04N 21/43615* (2013.01); *H04N 21/42227* (2013.01); *H04N 21/4782* (2013.01); *H04N 21/47214* (2013.01); *H04N 21/47217* (2013.01); *H04N 21/482* (2013.01); *H04N 2005/443* (2013.01); *H04N 2005/4408* (2013.01)

(58) Field of Classification Search
USPC .............................. 380/30, 44; 713/176, 180
See application file for complete search history.

(56) References Cited

U.S. PATENT DOCUMENTS

| | | | | |
|---|---|---|---|---|
| 5,410,326 A * | 4/1995 | Goldstein | ............... | G08C 23/04 340/12.26 |
| 5,847,704 A * | 12/1998 | Hartman | ............. | B60R 16/0231 340/439 |
| 6,018,340 A | 1/2000 | Butler et al. | | |
| 6,040,829 A | 3/2000 | Croy et al. | | |
| 6,097,441 A * | 8/2000 | Allport | ................ | H04N 5/4401 348/120 |
| 6,104,334 A | 8/2000 | Allport | | |
| 6,130,726 A | 10/2000 | Darbee et al. | | |
| 6,160,551 A | 12/2000 | Naughton et al. | | |
| 6,195,086 B1 * | 2/2001 | Perlman | ................... | G09G 5/12 345/1.1 |
| 6,285,357 B1 * | 9/2001 | Kushiro | ................ | G06F 3/0362 345/168 |
| 6,304,763 B1 * | 10/2001 | Jahagirdar | .......... | H04M 1/0214 345/169 |
| 6,331,840 B1 * | 12/2001 | Nielson | ................ | G06F 3/0488 345/1.1 |
| 6,396,523 B1 * | 5/2002 | Segal | .................... | G06F 1/1626 345/173 |
| 6,400,280 B1 * | 6/2002 | Osakabe | ............... | H03J 1/0025 340/12.31 |
| 6,437,836 B1 | 8/2002 | Huang et al. | | |
| 6,466,233 B1 | 10/2002 | Mitani | | |
| 6,791,467 B1 | 9/2004 | Ben-Ze'ev | | |
| 6,954,217 B1 * | 10/2005 | Nakayama | ............ | G01C 11/06 345/619 |
| 7,124,374 B1 * | 10/2006 | Haken | .................... | G06F 3/038 715/761 |
| 7,199,787 B2 * | 4/2007 | Lee | ....................... | G06F 3/0488 345/1.1 |
| 8,018,398 B1 * | 9/2011 | Harris | .................. | G06F 3/1431 345/1.1 |
| 2001/0035860 A1 * | 11/2001 | Segal | .................... | G06F 1/1626 345/173 |
| 2001/0037509 A1 * | 11/2001 | Kligman | ................ | H04N 7/181 725/105 |
| 2001/0052027 A1 * | 12/2001 | Tognazzini | ........... | G06F 1/1626 709/248 |
| 2002/0021283 A1 * | 2/2002 | Rosenberg | ............ | A63F 13/285 345/156 |
| 2002/0075198 A1 * | 6/2002 | Asahi | ..................... | G06F 3/1423 345/1.1 |
| 2002/0158887 A1 * | 10/2002 | Samra | .................. | G06F 17/241 345/619 |
| 2002/0191029 A1 * | 12/2002 | Gillespie | ............. | G06F 3/04817 715/810 |
| 2002/0192623 A1 * | 12/2002 | Sather | ...................... | G09B 7/00 434/118 |
| 2002/0196238 A1 * | 12/2002 | Tsukada | ................ | G06F 3/0421 345/173 |
| 2003/0001898 A1 | 1/2003 | Bernhardson | | |
| 2003/0025678 A1 * | 2/2003 | Lee | ........................ | G06F 3/0488 345/173 |
| 2004/0104942 A1 * | 6/2004 | Weigel | ................ | G06F 3/04886 715/773 |
| 2004/0248621 A1 * | 12/2004 | Schon | ................... | G06F 1/1616 455/566 |
| 2005/0024341 A1 * | 2/2005 | Gillespie | ................ | G06F 1/1616 345/173 |
| 2005/0075167 A1 * | 4/2005 | Beaulieu | .............. | G07F 17/3211 463/32 |
| 2005/0083642 A1 * | 4/2005 | Senpuku | ................ | G06F 1/1616 361/679.21 |
| 2006/0139321 A1 * | 6/2006 | Sakaguchi | ........ | H04N 21/23431 345/156 |
| 2007/0296604 A1 * | 12/2007 | Koyata | ................. | G06F 3/0238 340/4.3 |
| 2008/0074400 A1 * | 3/2008 | Gettemy | ................ | G06F 1/1622 345/173 |
| 2009/0322499 A1 * | 12/2009 | Pryor | ..................... | B60K 35/00 340/407.2 |
| 2010/0079681 A1 * | 4/2010 | Coburn | .................. | H03J 1/0025 348/734 |
| 2010/0182137 A1 * | 7/2010 | Pryor | .................. | G01C 21/3664 340/425.5 |
| 2010/0275033 A1 * | 10/2010 | Gillespie | ............ | G06F 3/04817 713/182 |
| 2010/0275163 A1 * | 10/2010 | Gillespie | ............ | G06F 3/04817 715/810 |
| 2014/0232943 A1 * | 8/2014 | Nashida | ................ | H03J 1/0025 348/734 |

FOREIGN PATENT DOCUMENTS

| | | |
|---|---|---|
| JP | 06-044001 | 2/1994 |
| JP | 06-319177 | 11/1994 |
| JP | 05-347785 | 12/1994 |
| JP | 200-059704 | 2/2000 |
| JP | 2001-077771 | 3/2001 |
| JP | 2001-094819 | 4/2001 |
| JP | 2001-175374 | 6/2001 |
| JP | 2000-035846 | 2/2002 |
| WO | WO8903085 | 4/1989 |
| WO | WO00/59212 | 10/2000 |

\* cited by examiner

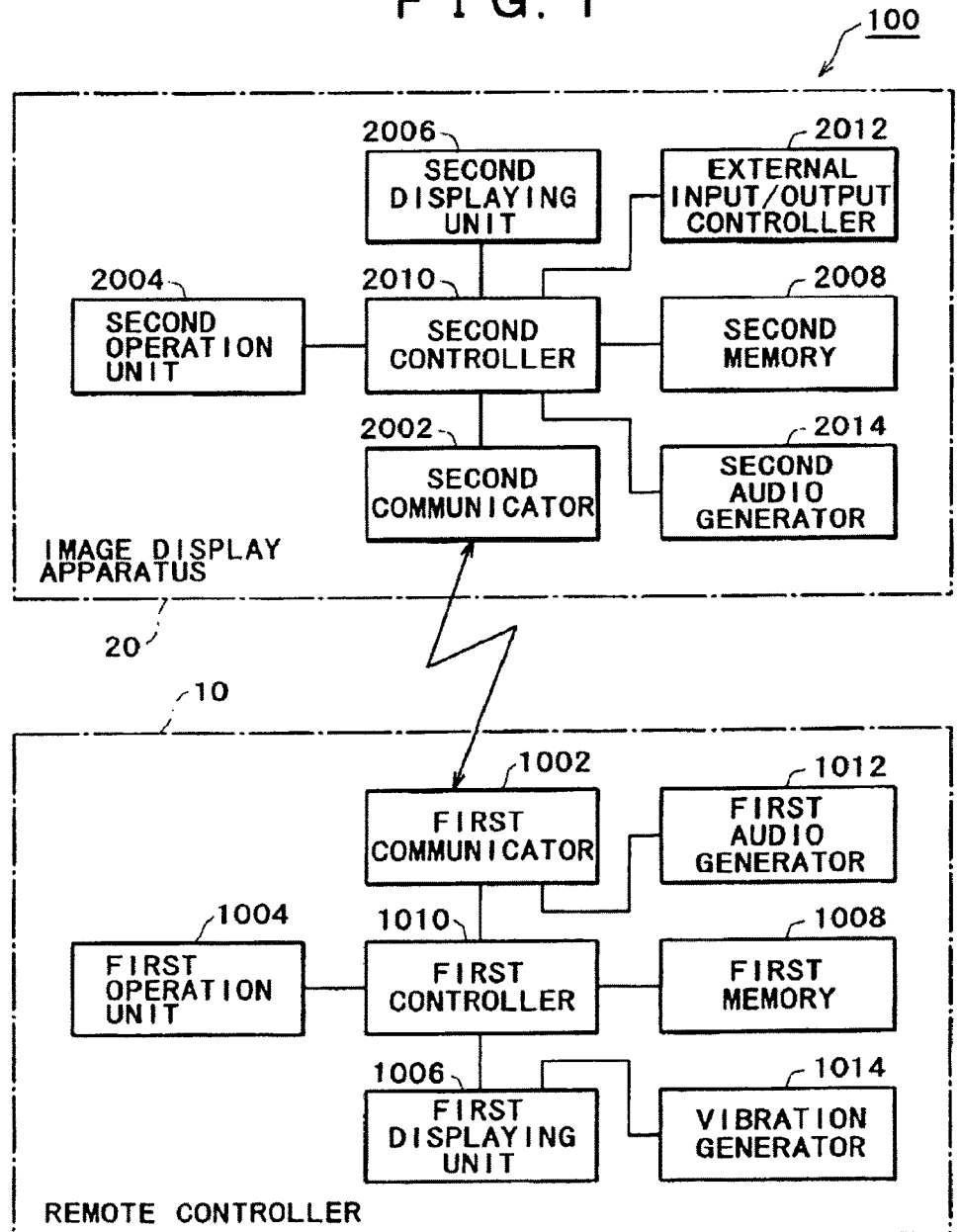

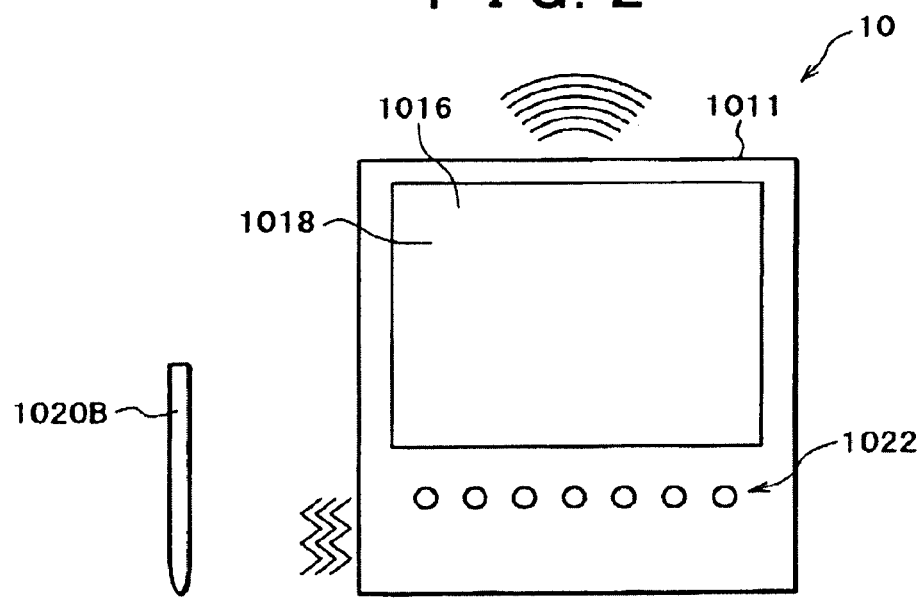
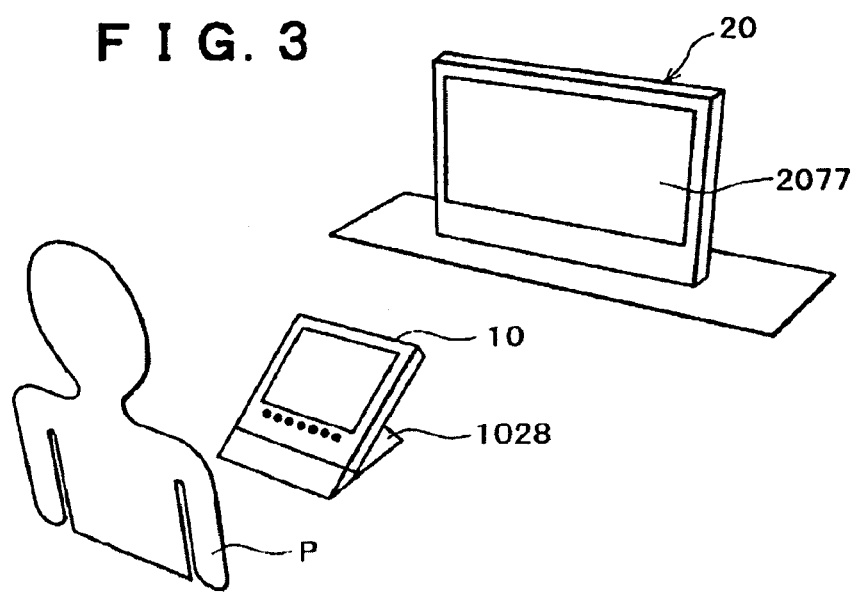

F I G. 1 0
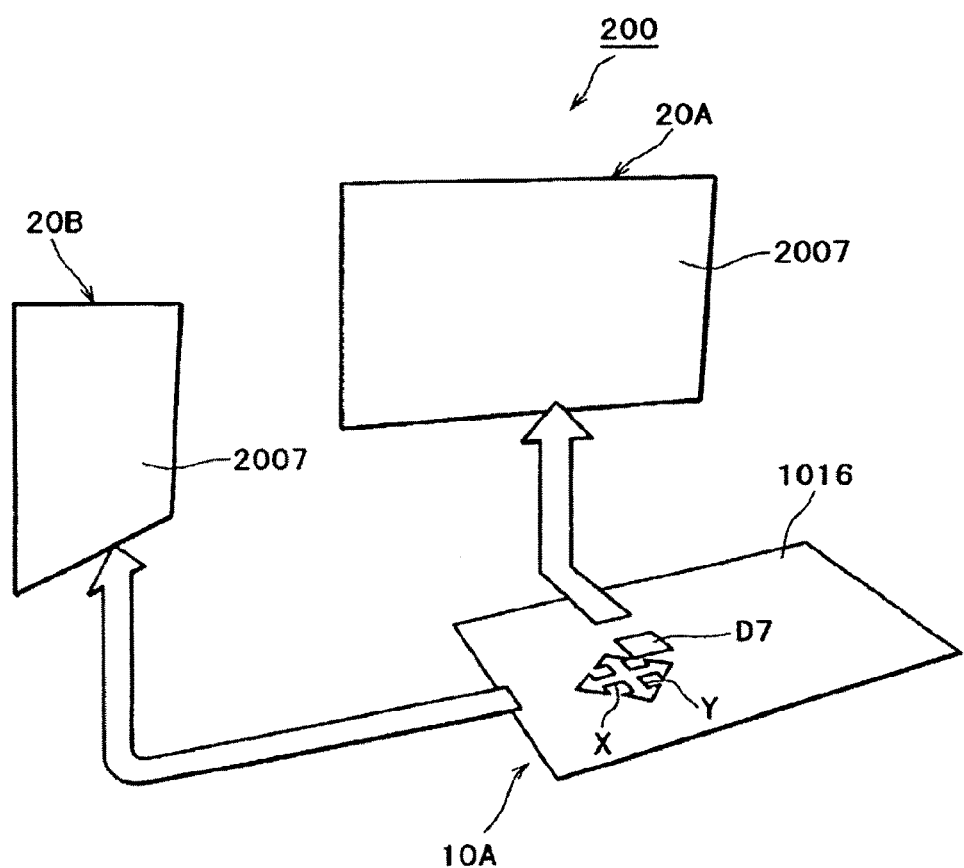

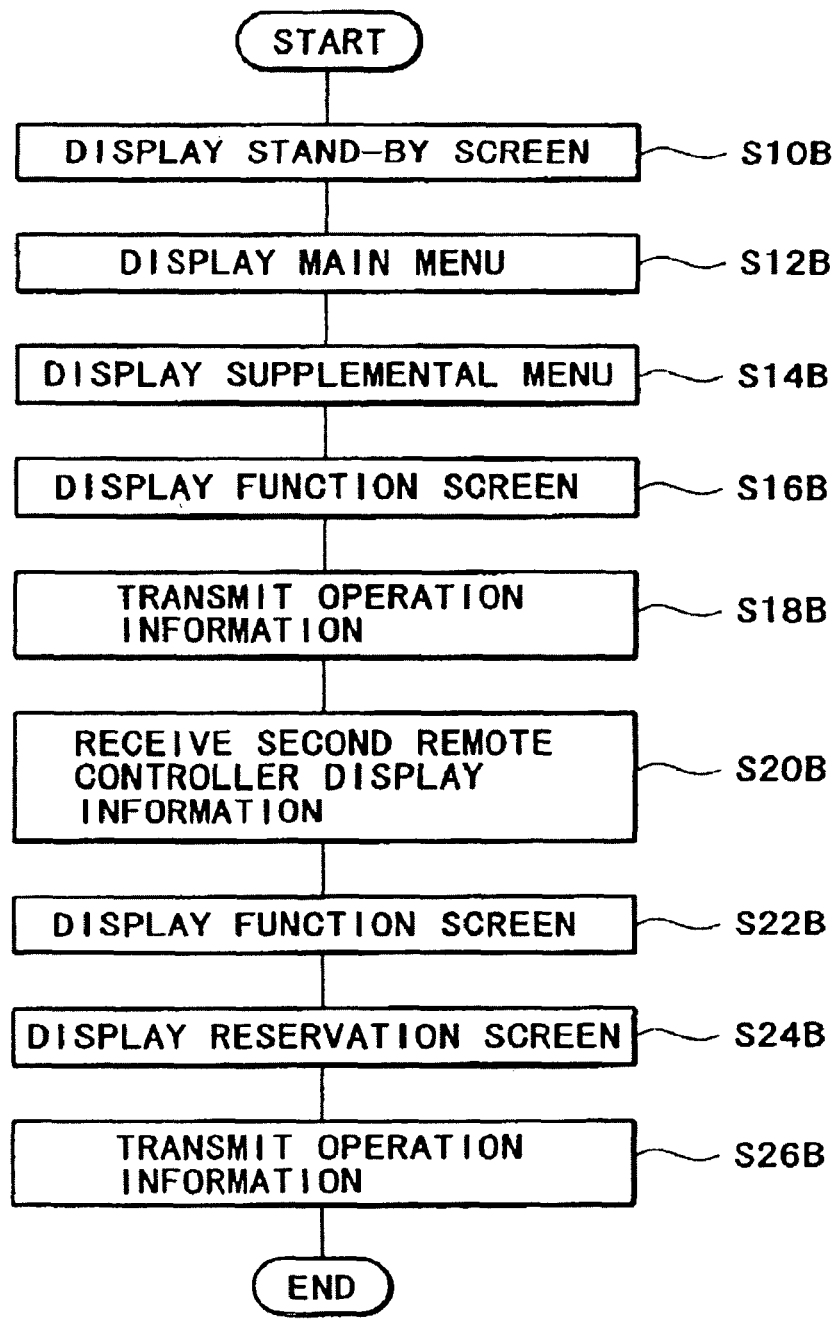

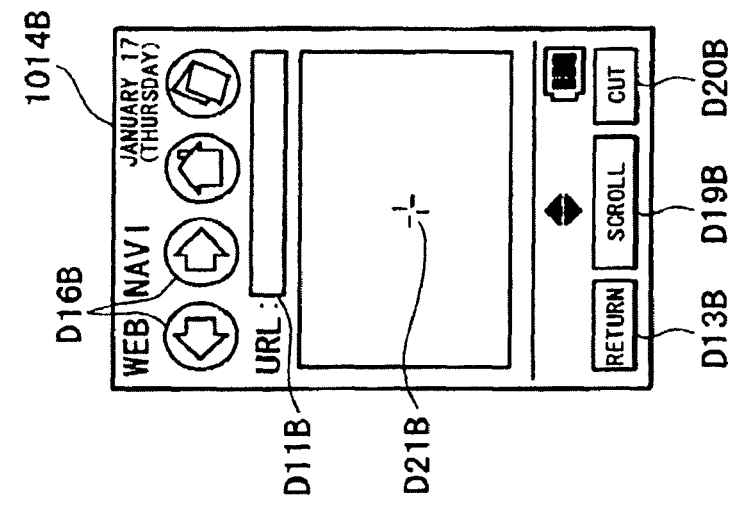
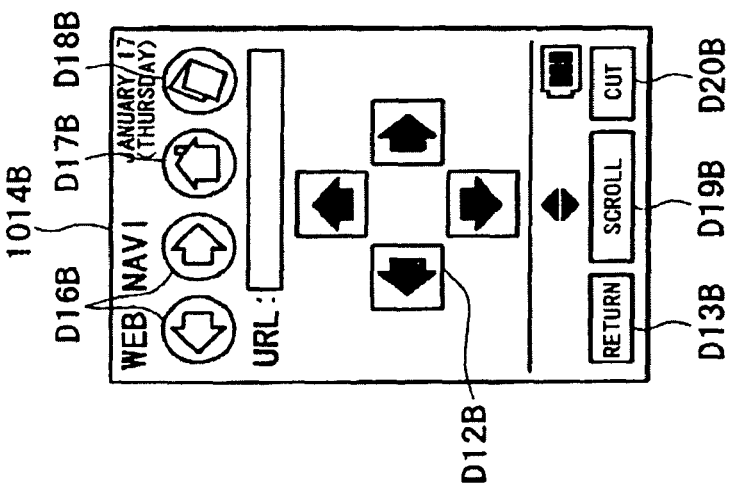
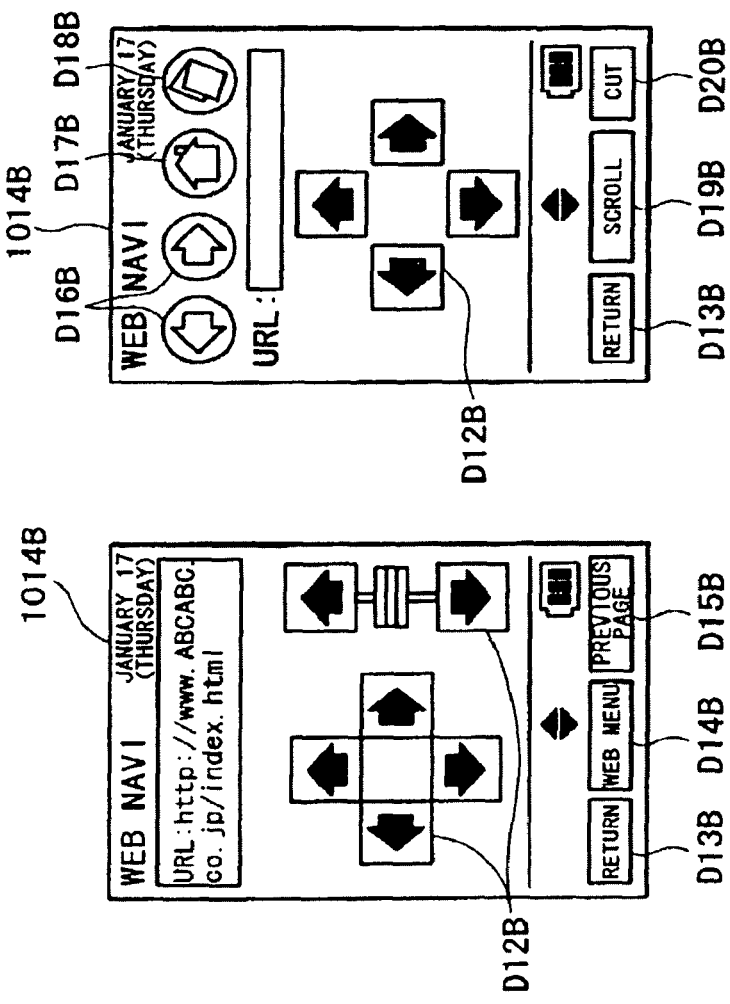

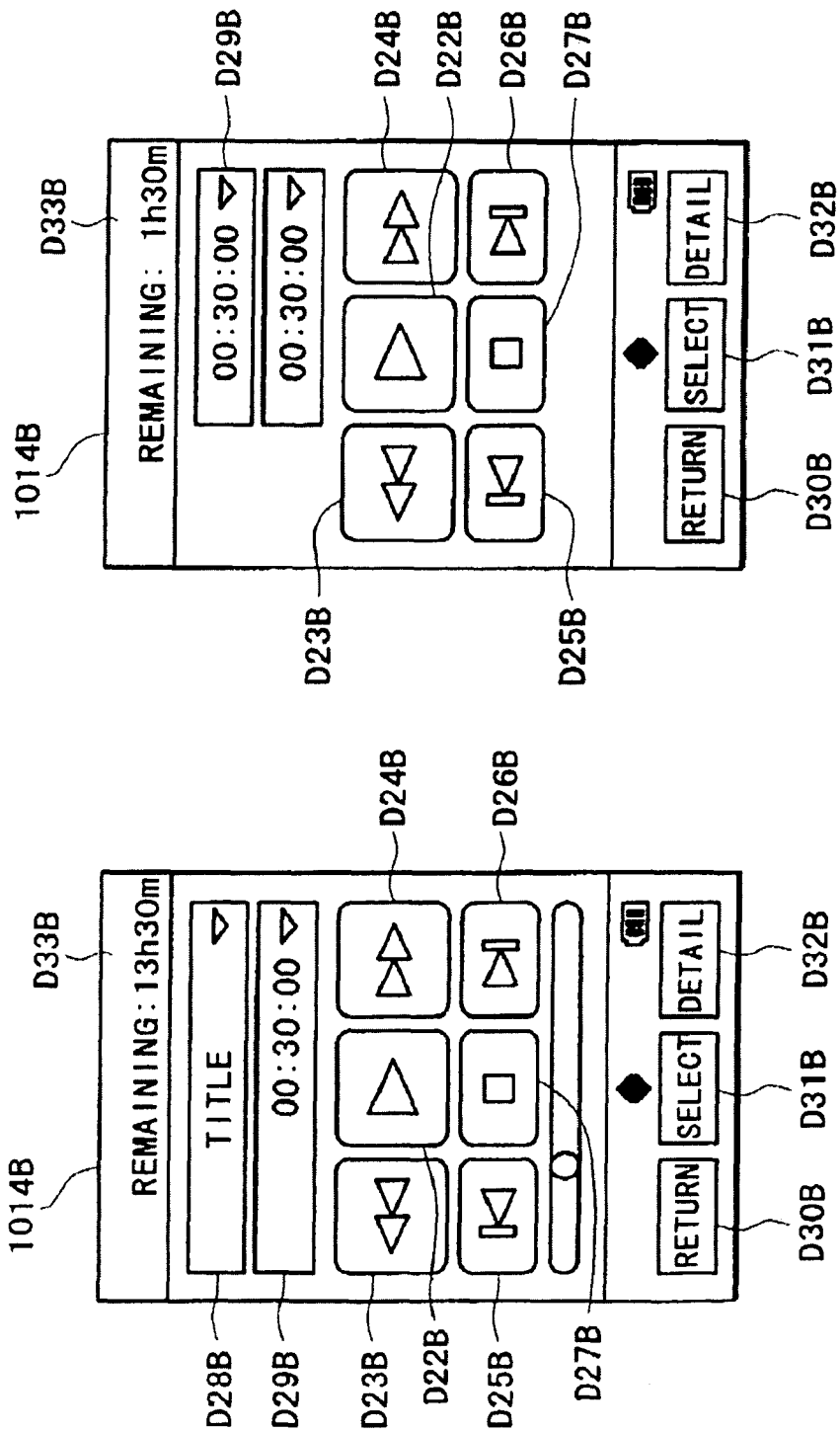

REMOTE CONTROLLER AND SYSTEM HAVING THE SAME

CROSS REFERENCES TO RELATED APPLICATIONS

This application is a continuation of U.S. patent application Ser. No. 11/717,439 (filed on Mar. 12, 2007), which is a continuation of U.S. patent application Ser. No. 10/192,268 (filed on Jul. 10, 2002 and has issued as U.S. Pat. No. 7,190,345), which claim priority to Japanese Priority Documents JP 2001-211854 and 2001-215188, filed in the Japanese Patent Office on Jul. 12, 2001 and Jul. 16, 2001, the entire contents of which being incorporated herein by reference.

BACKGROUND OF THE INVENTION

1. Field of the Invention

The present invention relates to a remote controller, an image display apparatus and a remote control system.

2. Description of Related Art

Conventionally, when an AV apparatus such as a television, a video recorder or the like is used for enjoyment of contents, a remote controller of such AV apparatus is used to send commands to perform remote operations.

SUMMARY OF THE INVENTION

In the remote controller of the AV apparatus, a plurality of buttons placed thereon are typically used in operation. Accordingly, more functionality the AV apparatus performs, more complex the operation becomes. Hence, it is not simple task for a typical user to operate such AV apparatus.

The present invention is conceived in view of such circumstances. It is desirable to provide a remote controller and remote control method that may provide better usability.

Furthermore, when many apparatuses such as a video camera, a DVD player, a BS (Broadcasting Satellite) tuner, a personal computer and the like are to be operated, an appropriate remote controller has to be used for controlling each corresponding apparatus, whereby imposing a heavy burden on a user.

For this reason, it is desirable to provide a remote controller, an image display apparatus and a remote control system that may provide better usability and not impose a burden on the user when such apparatuses are operated.

According to an embodiment of the present invention, there is provided a remote control system that includes an image display apparatus and a remote controller for controlling the image display apparatus. The remote controller includes a first displaying unit for displaying information, a first communicator for communicating information to the image display apparatus, and a first controller. The image display apparatus includes a second communicator for communicating information to the first communicator. The first communicator transmits operational information to operate the image display apparatus to the second communicator. The first controller carries out controlling of the first displaying unit so that, if the first communicator transmits operational information to the second communicator, a remote controller side display information associated with the operational information is displayed on the first displaying unit, and a display position of the remote controller side display information displayed on the first displaying unit is moved towards the image display apparatus.

For this reason, if the first communicator transmits the operational information to the second communicator, the remote controller side display information associated with the operational information is controlled such that its display position is moved towards the image display apparatus. Thus, it is possible to generate visual effect as if the remote controller side display information is physically moving from the first displaying unit of the remote controller to the image display apparatus, thereby giving impression to a user that the image display apparatus is indeed remotely controlled.

According to another embodiment of the present invention, there is provided a remote controller for controlling an image display apparatus. The remote controller includes: a third displaying unit for displaying a remote controller display information; a third operation unit for generating operational information based on a user's operation; a third communicator for conducting two-way information communication to the image display apparatus; and a third controller for displaying remote controller display information on the third displaying unit, and transmitting the operational information to the image display apparatus by using the third communicator. The remote controller display information displayed on the third displaying unit includes a third remote controller display information transmitted to the third communicator from the image display apparatus.

Accordingly, as the remote controller display information displayed on the third displaying unit of the remote controller, it is possible to use the third remote controller display information transmitted to the third communicator from the image display apparatus.

Furthermore, according to still another embodiment of the present invention, there is provided an image display apparatus that can be remotely operated by a remote controller. The image display apparatus includes: a fourth communicator for conducting two-way information communication to the remote controller; and a fourth controller. The fourth controller controls operation of the image display apparatus in accordance with operational information, which is received by the fourth communicator from the remote controller, and transmits a third remote controller display information to be displayed on a third displaying unit provided in the remote controller to the remote controller by using the fourth communicator.

Accordingly, as the remote controller display information to be displayed on the remote controller, it is possible to use the third remote controller display information transmitted to the remote controller from the fourth communicator of the image display apparatus.

Furthermore, according to still another embodiment of the present invention, there is provided a remote control system including an image display apparatus and a remote controller for remotely controlling the image display apparatus. The remote controller is provided with a third displaying unit for displaying a remote controller display information, a third operation unit for generating operational information based on a user's operation, a third communicator for conducting two-way information communication to the image display apparatus, and a third controller. The image display apparatus comprises a fourth communicator for conducting two-way information communication to the remote controller, and a fourth controller. The third controller controls to display the remote controller display information on the third displaying unit, and transmits the operational information to the fourth communicator by using the third communicator. The fourth controller controls an operation of the image display apparatus in accordance with the operational information received from the third communicator, and transmits a third remote controller display information to the remote controller by using the fourth communicator. The remote controller display information displayed on the third displaying unit by the third controller includes the third remote controller display information.

Accordingly, as the remote controller display information displayed on the third displaying unit of the remote controller, it is possible to use the third remote controller display information transmitted to the third communicator of the remote controller from the fourth communicator of the image display apparatus.

In the present invention, embodiments in which the remote controller is used to control the image display apparatus. Alternatively, the remote controller of the present invention may also be used to control other apparatus having a display.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which FIG. 1 is a block diagram showing a configuration of a remote control system in a first embodiment;

FIG. 2 is a plan view showing a remote controller in the first embodiment;

FIG. 3 is an explanation view showing a usage state of the remote control system in the first embodiment;

FIG. 4(B1) to FIG. 4(B5) are explanation views showing display contents on a display screen of the remote controller in the first embodiment;

FIG. 7(B1) to FIG. 7(B4) are explanation views showing display contents on a display screen of the remote controller in the second embodiment;

FIG. 9(B1) to FIG. 9(B4) are explanation views showing display contents on a display screen of the remote controller in the third embodiment;

FIG. 10 is an explanation view showing a configuration of a remote control system in a fourth embodiment;

FIG. 16 is an operational flowchart of a remote control system in another embodiment of the present invention;

FIG. 17A is an explanation view showing a display screen when WWW is read;

FIG. 17B is an explanation view showing another display screen when WWW is read;

FIG. 17C is an explanation view showing still another display screen when WWW is read;

FIG. 18A is an explanation view showing a display screen at a time of a reproduction through a video recorder; and FIG. 18B is an explanation view showing a display screen at a time of a reproduction through a video camera.

DETAILED DESCRIPTION OF THE PREFERRED EMBODIMENTS

Figure 4:
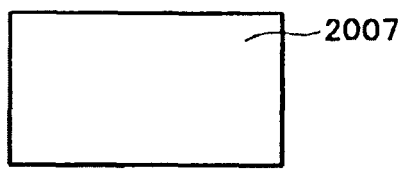
FIG. 4(A1) to FIG. 4(A5) are explanation views showing display contents on a display screen of an image display apparatus in the first embodiment.
Figure 4:
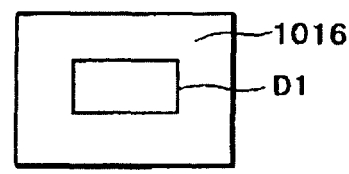
Figure 4:
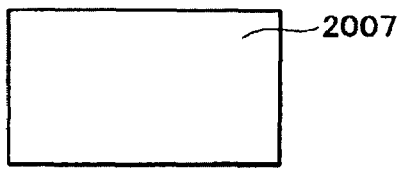
Figure 4:
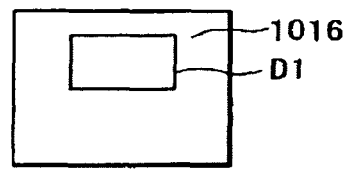
Figure 4:
Figure 4:
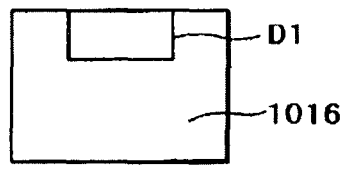
Figure 4:
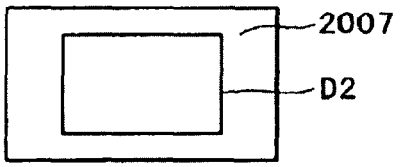
Figure 4:
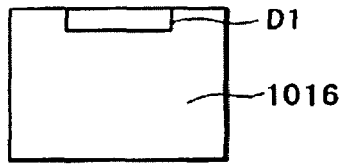
Figure 4:
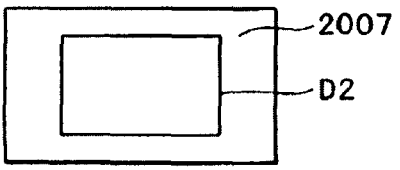
Figure 4:
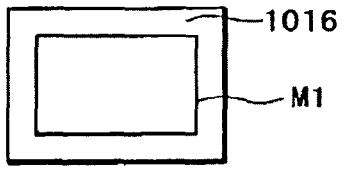

Remote control systems in accordance with embodiments of the present invention will be described below.

FIG. 1 is a block diagram showing a configuration of a remote control system in a first embodiment. A remote control system 100 is provided with a remote controller 10 and an image display apparatus 20 that may be remotely controlled by this remote controller 10.

The remote controller 10 is provided with a first communicator 1002, a first operation unit 1004, a first displaying unit 1006, a first memory 1008, a first controller 1010, a first audio generator 1012, a vibration generator 1014 and a battery (not shown) that functions as a power supply, and the like.

The first communicator 1002 is configured so as to carry out two-way wireless communication to a second communicator 2002 of the image display apparatus 20. The present embodiment is described under an assumption that an infrared-ray communication is used as the wireless communication between the image display apparatus 20 and the remote controller 10.

The first operation unit 1004 carries out operation for remotely controlling the image display apparatus 20, and it is configured so as to generate operational information based on the operation performed by a user and enter it into the first controller 1010. The actual configuration of the first operation unit 1004 will be described later.

The first displaying unit 1006 may comprise, for example, a liquid crystal display, and it is configured so as to display the remote controller side display information. The remote controller side display information is used for operating the first operation unit 1004. Incidentally, the actual configuration of the first displaying unit 1006 will be described later.

The first memory 1008 may comprise a ROM region for storing a program to be carried out by the first controller 1010 and a RAM region that can be used to write/read data by the first controller 1010.

The first audio generator 1012 generates a predetermined audio signal under control of the first controller 1010. The audio signal is outputted so as to inform so as to inform the user that the operational information is transmitted to the image display apparatus 20 from the remote controller 10. Details will be described later.

The vibration generator 1014 generates a predetermined vibration under control of the first controller 1010. The vibration is generated so as to inform the user that the operational information is transmitted to the image display apparatus 20 from the remote controller 10. Details will be described later.

The first controller 1010 comprises a CPU and configured so as to be operated by executing operational programs stored in the first memory 1008. The first controller 1010 controls the first communicator 1002, the first operation unit 1004, the first displaying unit 1006, the first memory 1008, the first audio generator 1012 and the vibration generator 1014.

As shown in FIG. 2, the remote controller 10 comprises a case 1011 having a rectangular tablet shape.

On a top surface of the case 1011, a display surface 1016 of the first displaying unit 1006 is placed at a position closer to a front side of the top surface so that the display surface 1016 faces externally for a user's view. The first displaying unit 1006 is configured such that characters, figures, symbols, still image information and moving image information can be displayed on the display surface 1016.

To cover the display surface 1016, a touch panel 1018 having the same shape as the outer shape of the display surface 1016 is placed on the display surface 1016 so that the touch panel 1018 placed on top of the display surface 1016. The touch panel 1018 is configured such that contents displayed on the display surface 1016 can be transparently viewed thereby enabling the user to operate the touch panel 1018 by a touch of a finger or a pen 1020.

The display surface 1016 and the touch panel 1018 are configured to carry out the operation similar to that of a tablet that functions as a pointing device, in accordance with the control of the controller 1010. Accordingly, it is possible to use the pen 1020 to select one or a group of image information displayed on the display surface 1016, drag the selected image or any other pointing operation.

A plurality of operational buttons 1022 are placed on bottom side of the display surface 1016. The first operation unit 1004 (operating device) comprises the touch panel 1018 and the operational buttons 1022.

Further, an infrared-ray receiving/emitting device (not shown) constituting the first communicator 1002 is placed at a position of a front end of the case 1011. An infrared-ray signal is transmitted (light is emitted) from this infrared-ray receiving/emitting device. Then, the infrared-ray signal is received (the light is received) by the infrared-ray receiving/emitting device.

As shown in FIG. 1, the image display apparatus 20 comprises the second communicator 2002, a second operation unit 2004, a second displaying unit 2006, a second memory 2008, a second controller 2010, an external input/output controller 2012 and an audio generator 2014.

The second communicator 2002 is configured so as to carry out two-way wireless communication to the first communicator 1002. The present embodiment is described under the assumption that the infrared-ray communication is used as the wireless communication.

The second communicator 2002 is configured so as to transmit the remote controller side display information to the first communicator 1002.

The second operation unit 2004 is configured so as to carry out a direct operation of the image display apparatus 20 and generate operational information based on the user's operation. The generated operational information is entered into the second controller 2010.

The second displaying unit 2006 comprises, for example, a CRT, a liquid crystal display or a plasma display. The second displaying unit 2006 is configured so as to display a still image information and a moving image information on its display surface 1007 (refer to FIG. 3).

The second memory 2008 comprises a ROM region for storing programs to be carried out by the second controller 2010, a ROM region for storing information required for the program execution and a RAM region that can be written/read by the second controller 2010.

The external input/output controller 2012 interfaces a reception or an output of a signal from or to an external apparatus and selects an input signal (contents). External apparatuses that can be connected to the external input/output controller 2012 may include various AV apparatuses such as a television tuner, a video recorder, a video camera, a radio, a personal computer and the like.

Accordingly, the external input/output controller 2012 may be able to receive an image signal and an audio signal of a television broadcast, an image signal and an audio signal from a video recorder or a video camera, and an audio signal from a radio.

Furthermore, the external input/output controller 2012 has a function of transmitting and receiving a data signal and a control signal to and from a personal computer.

Furthermore, the external input/output controller 2012 may be connected to Internet through a network such as LAN or the like. In this case, it is necessary that the external input/output controller 2012 is configured as a terminal device having a network communicating function.

The external input/output controller 2012 is configured so as to select those signals in accordance with control of the second controller 2010, and enter the selected signals into the second displaying unit 2006 ansa the audio generator 2014, or output signals as required.

The audio generator 2014 comprises a speaker and an amplifier (which are not shown) and the like. The audio generator 2014 is configured so as to generate audio signals from an input signal and output the generated audio signal. Furthermore, the audio generator 2014 generates a predetermined audio signal in accordance with control of the second controller 2010. This audio signal is generated so as to inform the user that the operational information corresponding to the user's operation is transmitted to the image display apparatus 20 from the remote controller 10. Details will be described below.

The second controller 2010 comprises a CPU and configured so as to be operated by carrying out operational programs stored in the second memory 2008. The second controller 2010 controls the second communicator 2002, the second operation unit 2004, the second displaying unit 2006, the second memory 2008, the external input/output controller 2012 and the audio generator 2014. Furthermore, the second controller 2010 generates the remote controller side display information to be transmitted to the remote controller 10.

FIG. 3 is an explanation view schematically illustrating displays to be used during operation of the remote control system 100.

As shown in FIG. 3, a user P located at a position away from the image display apparatus 20 operates the operation unit 1004 of the remote controller 10 to remotely control the image display apparatus 20. The remote controller 10 carries out two-way communication between the first communicator 1002 and the second communicator 2002 of the image display apparatus 20.

Furthermore, a charging device (battery charger) 1028 is placed in the vicinity of the image display apparatus 20. It is configured such that the battery is charged by placing the remote controller 10 on the charging device 1028.

The operation of the remote control system 100 and remote operation of the image display apparatus 20 will be described below with reference to FIG. 4(A1) to FIG. 4(A5).

FIGS. 4(A1) to 4(A5) are explanation views showing displayed contents of the display surface 2007 of the image display apparatus 20, and FIG. 4(B1) to FIG. 4(B5) are explanation views showing displayed contents of the display surface 1016 of the remote controller 10.

Figure 5:
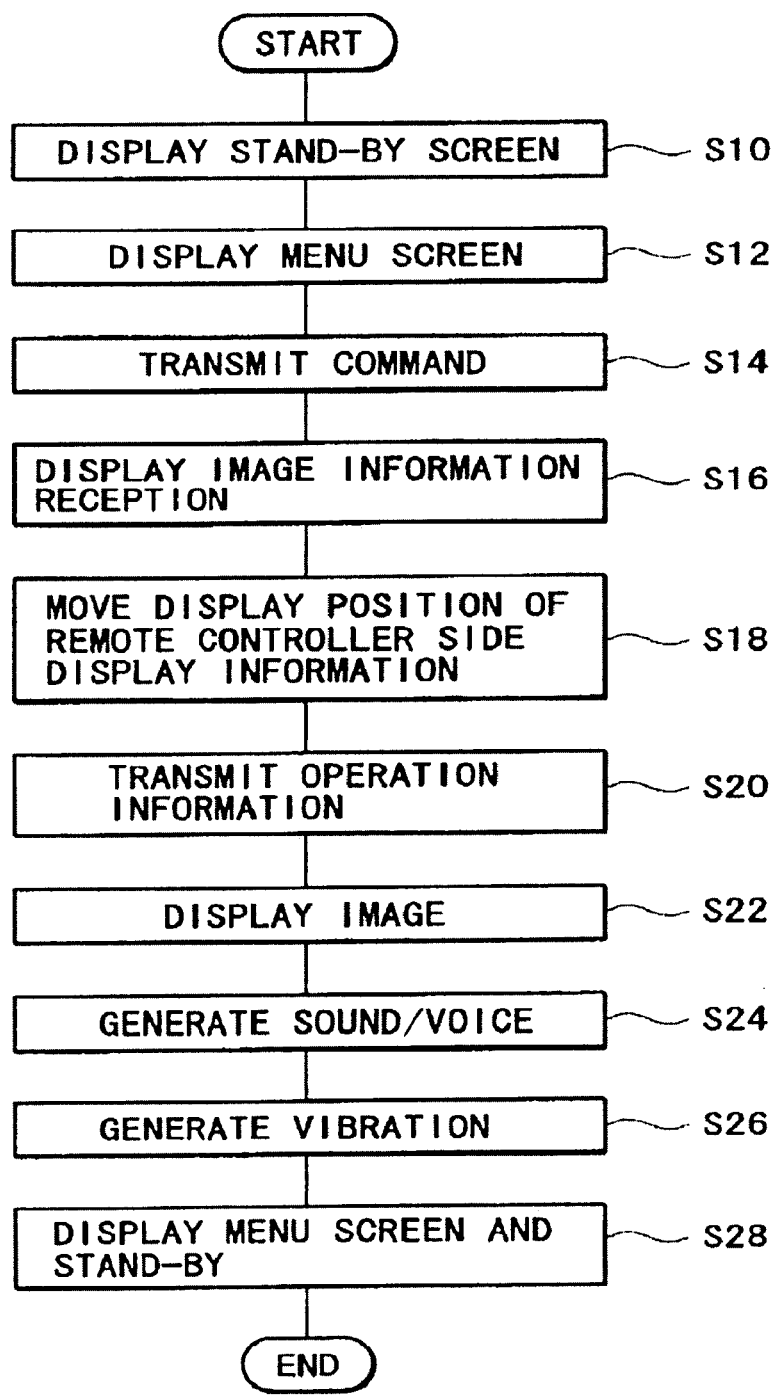
FIG. 5 is a flowchart showing an operation of the remote control system.

FIG. 5 is a flowchart showing the operation of the remote control system. Here, it is assumed that the remote controller 10 and the image display apparatus 20 are at stand-by mode at first.

At the stand-by mode, the remote controller 10 displays a predetermined stand-by screen image on the display surface 1016 (Step S10).

Here, when the user P touches the touch panel 1018 of the remote controller 10, the second controller 2010 starts a preset processing to, for example, display a predetermined menu screen on the display surface 1016 (Step S12). Functions that may be controlled by the remote controller 10 are displayed on the menu screen in form of various icons. For example, icons that trigger viewing of different apparatuses such a television, a video, a video camera, a DVD, Internet and the like may be displayed.

When the user P selects one of the icons corresponding to viewing of the television by using the pen 1020, as shown in FIG. 4(B1), the first controller 1010 transmits a command of requesting transmission of image information of the last channel of the television displayed on the image display apparatus 20, to the second communicator 2002 from the first communicator 1002 (Step S14).

Since the command is received by the second communicator 2002, the second controller 2010 controls the external input/output controller 2012, and transmits the image information of the last displayed channel from the second communicator 2002 to the first communicator 1002. Accordingly, the remote controller 10 displays the image information of the last channel received by the first communicator 1002, as a remote controller side display information D1, on the display surface 1016 (Step S16).

At this time, as shown in FIG. 4(A1), nothing is displayed on the display surface 2007 of the image display apparatus 20.

Next, as shown in FIG. 4(B2), FIG. 4(B3) and FIG. 4(B4), since the user P uses the pen 1020 and selects the remote controller side display information D1 and drags forwardly, namely, towards the image display apparatus 20, a display position of the remote controller side display information D1 on the display surface 1016 is visually moved towards the image display apparatus 20 (Step S18).

In accordance with the movement operation of the remote controller side display information D1 done by the first operation unit 1004, the first controller 1010 transmits the operational information associated with the remote controller side display information D1, namely, the command of requesting the display of the last displayed channel on the display surface 2007, from the first communicator 1002 to the second communicator 2002 (Step S20).

The transmission of the remote controller side display information D1 and the operational information from the first controller 1010 may be initiated when a part of the remote controller side display information D1 arrives at an edge of the display surface 1016.

In accordance with the fact that the second communicator 2002 receives the command, the second controller 2010 controls the external input/output controller 2012, and displays an image of the last displayed channel as an image display apparatus side display information D2, as shown in FIG. 4(A4), FIG. 4(A5) (Step S22).

At this time, in order to inform the user that the command (operational information) is transmitted to the image display apparatus 20 from the remote controller 10, the first controller 1010 generates a predetermined audio signal from the first audio generator 1012, for example, an audio signal to be changed from a tone of a high frequency to a low tone, and also generates a predetermined vibration by using the vibration generator 1014 (Step S24).

Similarly, the second controller 2010 generates a predetermined audio signal from the second audio generator 2014, for example, an audio signal to be changed from a tone of a low frequency to a high tone (Step S26).

On the other hand, the first controller 1010 displays a television channel selection menu Ml, and waits for an operational input to select a television channel (Step S28).

As mentioned above, according to the first embodiment, when the first communicator 1002 transmits the operational information to the second communicator 2002, the first controller 1010 controls the first displaying unit 1006 so that the display position of the remote controller side display information D1 associated with the operational information is moved towards the image display apparatus 20.

Figure 6:
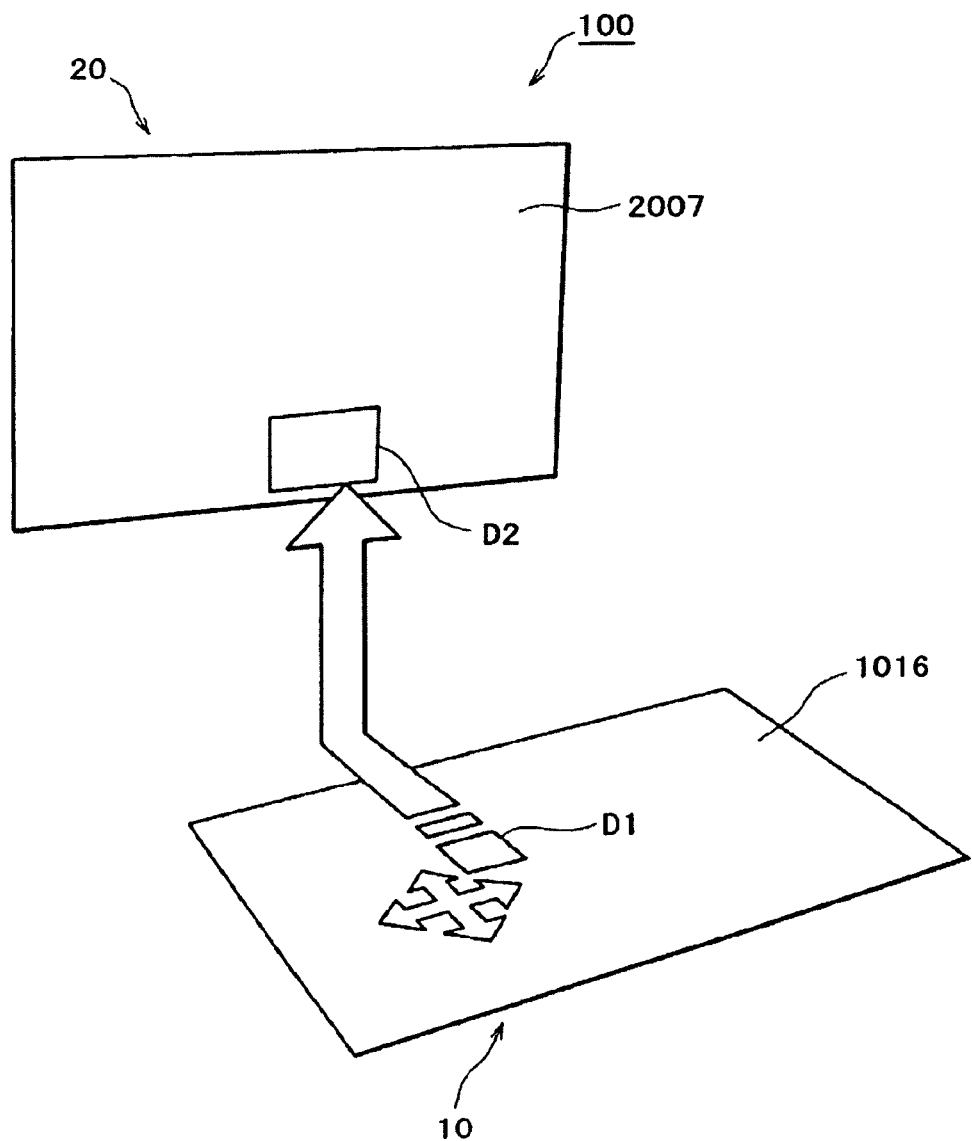
FIG. 6 is an explanation view of display states in the remote controller and the image display apparatus in the first embodiment.

Thus, as shown in FIG. 6, the visual effect as if the remote controller side display information D1 is physically moved towards the image display apparatus 20 from the display surface 1016 of the remote controller 10 so that the user P may have an impression of remotely controlling the image display apparatus 20. This is advantage of the present embodiment. According to the present embodiment, easiness of the remote operation by using the remote controller 10 may be improved.

With the transmission of the operational information to the image display apparatus 20 from the remote controller 10, the audio signal is generated in the remote controller 10 and the image display apparatus 20, and the remote controller 10 is vibrated.

For this reason, the transmission of the operational information can be recognized in forms of the audio signal and the vibration. This is advantage of the present invention and enables to improve easiness of the remote operation by using the remote controller 10.

A second embodiment will be described below with reference to FIGS. 5, 7.

Figure 7:
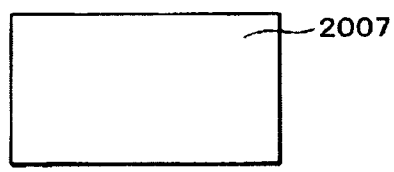
FIG. 7(A1) to FIG. 7(A4) are explanation views showing display contents on a display screen of an image display apparatus in a second embodiment.
Figure 7:
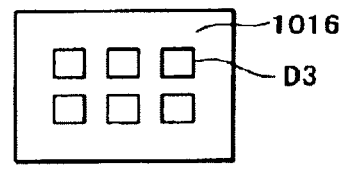
Figure 7:
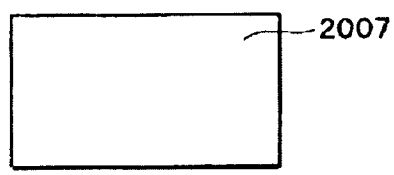
Figure 7:
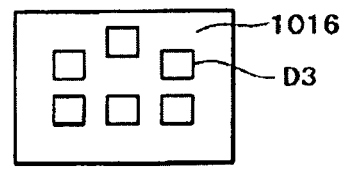
Figure 7:
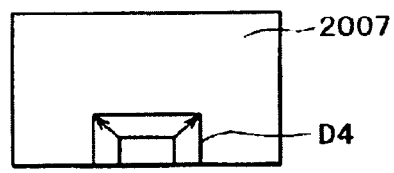
Figure 7:
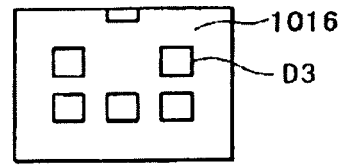
Figure 7:
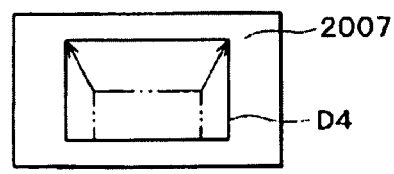
Figure 7:
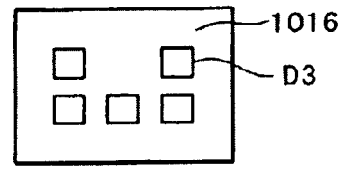

FIGS. 7(A1) to 7(A4) are explanation views showing the display content on the display surface 2007 of the image display apparatus 20, and FIGS. 7(B-1) to 7(B4) are explanation views showing the display content on the display surface 1016 of the remote controller 10.

The different points of the second embodiment from the first embodiment are the manner of the remote controller side display information displayed on the display surface 1016 of the remote controller 10 and the operational information associated thereto.

It will be described below along the flowchart of FIG. 5. At first, a stand-by screen is displayed (Step S10), and a menu screen is displayed, and a reproduction using a video camera is selected (Step S12).

Accordingly, as shown in FIG. 7(B-1), the first controller 1010 transmits a command of requesting a transmission of a thumbnail image of an image recorded in the video camera, from the first communicator 1002 to the second communicator 2002 (Step S14).

Since the command is received by the second communicator 2002, the second controller 2010 controls the external input/output controller 2012, and transmits the image information of the thumbnail obtained from the video camera, from the second communicator 2002 to the first communicator 1002. Accordingly, the remote controller 10 displays the image information of the thumbnail received by the first communicator 1002, as a remote controller side display information D3, on the display surface 1016 (Step S16).

At this time, as shown in FIG. 7(A1), nothing is displayed on the display surface 2007 of the image display apparatus 20.

Next, as shown in FIGS. 7(B2), 7(B3) and 7(B4), since the user P uses the pen 1020 and selects one of the display information D3 and drags forwardly, namely, towards the image display apparatus 20, a display position of the remote controller side display information D3 on the display surface 1016 is visually moved towards the image display apparatus 20 (Step S18).

In accordance with the movement operation of the remote controller side display information D3 done by the first operation unit 1004, the first controller 1010 transmits the operational information associated with the remote controller side display information D3, namely, the command of requesting the display of the image information corresponding to the remote controller side display information D3 on the display surface 2007, from the first communicator 1002 to the second communicator 2002 (Step S20).

The transmission of the operational information from the first controller 1010 may be started when a part of the display information D3 arrives at the edge of the display surface 1016.

In accordance with the fact that the second communicator 2002 receives the command, the second controller 2010 controls the external input/output controller 2012 so as to display an image display apparatus side display information D4 composed of the image information corresponding to the remote controller side display information D3 from the video camera, as shown in FIGS. 4(A4), 4(A5) (Step S22).

At this time, as shown in FIGS. 7(A3), 7(A4), the display of the image display apparatus side display information D4 on the second displaying unit 2006 is done so as to provide the visual effect as if the remote controller side display information D3 was physically moved to the image display apparatus from the remote controller 10.

Moreover, the second controller 2010 controls the second displaying unit 2006 so that the image display apparatus side display information D4 displayed on the second displaying unit 2006 has the size corresponding to the dimension of the display screen of the display surface 2007, namely, it is enlarged fully on the display screen and displayed, in this embodiment.

The operations of the steps S24, S26 are similar to those of the first embodiment.

Furthermore, the first controller 1010 waits for an operational input to select a next thumbnail image (remote controller side display information D3) (Step S28).

Figure 8:
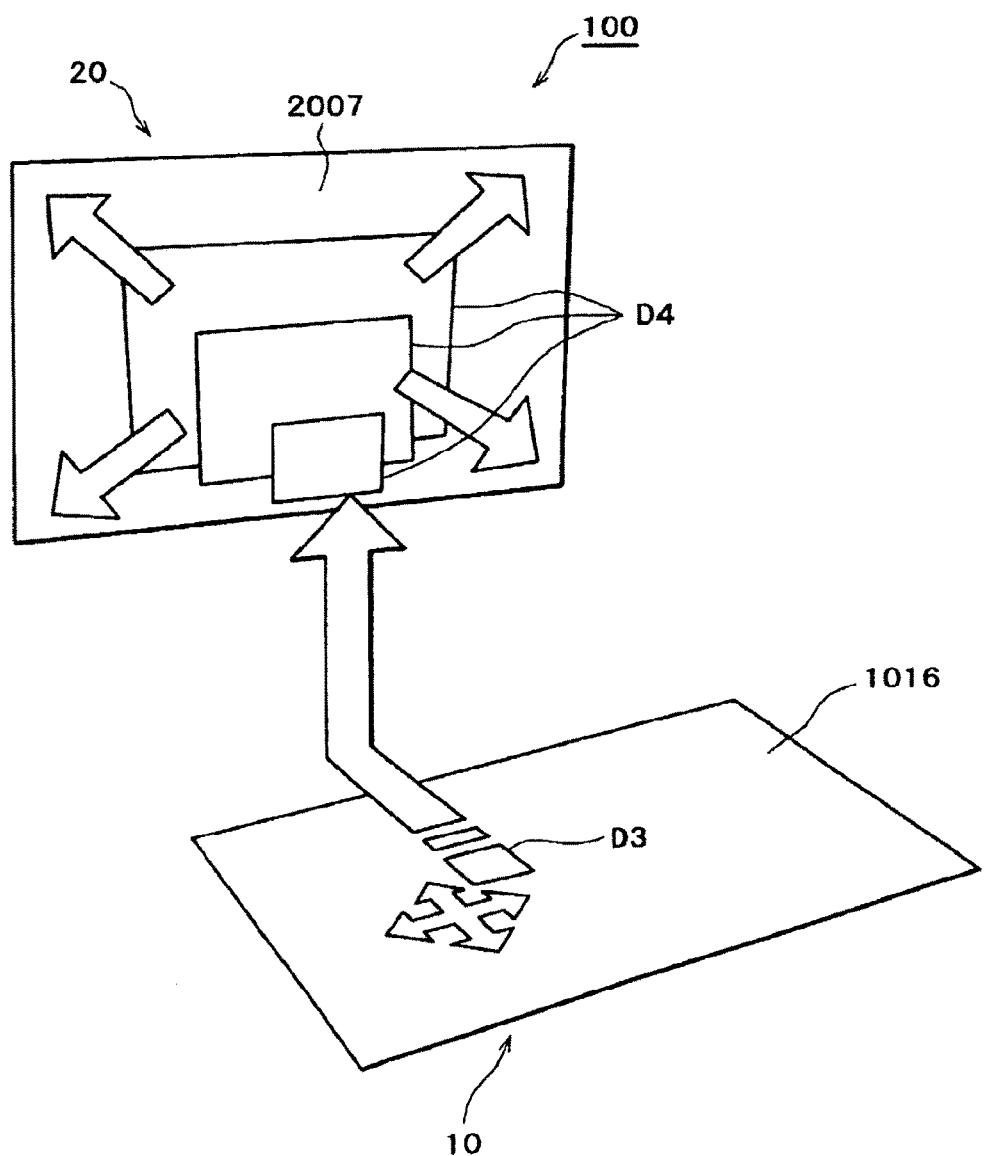
FIG. 8 is an explanation view of display states in the remote controller and the image display apparatus in the second embodiment.

As mentioned above, according to the second embodiment, in addition to the effect of the first embodiment, as shown in FIG. 8, this has the effect of further increasing the visual effect as if the remote controller side display information D3 was physically moved to the image display apparatus 20 from the remote controller 10. Thus, this is advantageous in improving easiness of the remote operation by using the remote controller 10.

Moreover, as shown in FIG. 8, the image display apparatus side display information D4 displayed on the second displaying unit 2006 has the size corresponding to the dimension of the display screen of the display surface 2007. Thus, this is advantageous in making the image display apparatus side display information D4 easily visible.

A third embodiment will be described below with reference to FIGS. 5, 9.

Figure 9:
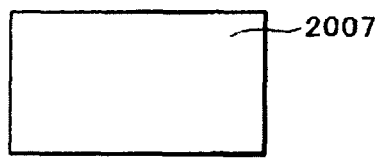
FIG. 9(A1) to FIG. 9(A4) are explanation views showing display contents on a display screen of an image display apparatus in a third embodiment.
Figure 9:
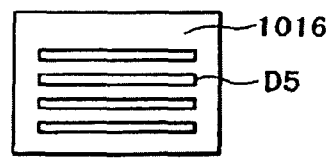
Figure 9:
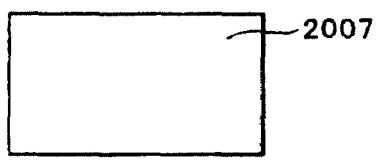
Figure 9:
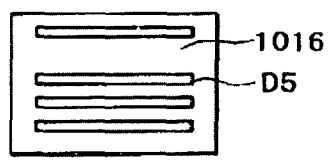
Figure 9:
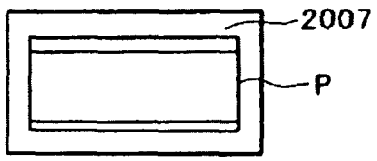
Figure 9:
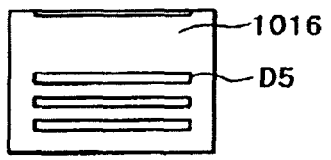
Figure 9:
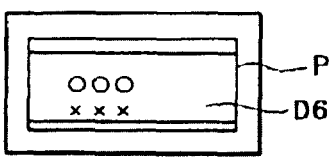
Figure 9:
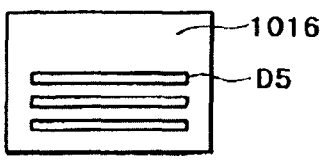

FIGS. 9(A1) to 9(A4) are explanation views showing the display content on the display surface 2007 of the image display apparatus 20, and FIGS. 9(B-1) to 9(B4) are explanation views showing the display content on the display surface 1016 of the remote controller 10.

The different points of the third embodiment from the first embodiment are the manner of the remote controller side display information displayed on the display surface 1016 of the remote controller 10 and the operational information associated thereto.

It will be described below along the flowchart of FIG. 5. At first, the stand-by screen is displayed (Step S10), and the menu screen is displayed, and a recording of WWW is selected (Step S12).

Accordingly, the first controller 1010 transmits a command of requesting a transmission of a URL (Uniform Resource Locator) information, from the first communicator 1002 to the second communicator 2002 (Step S14).

Since the command is received by the second communicator 2002, the second controller 2010 controls the external input/output controller 2012, and transmits the URL information obtained from the terminal device, from the second communicator 2002 to the first communicator 1002. Accordingly, as shown in FIG. 9(B-1), the remote controller 10 displays the URL information received by the first communicator 1002, as a remote controller side display information D5, on the display surface 1016 (Step S16).

At this time, as shown in FIG. 9(A1), nothing is displayed on the display surface 2007 of the image display apparatus 20.

Next, as shown in FIGS. 9(B2), 9(B3) and 9(B4), since the user P uses the pen 1020 and selects one of the display information D5 and drags forwardly, namely, towards the image display apparatus 20, a display position of the remote controller side display information D5 on the display surface 1016 is visually moved towards the image display apparatus 20 (Step S18).

In accordance with the movement operation of the remote controller side display information D5 done by the first operation unit 1004, the first controller 1010 transmits the operational information associated with the remote controller side display information D5, namely, the WWW reading operation based on the remote controller side display information D5, actually, the command of requesting to actuate a browser and display a browser screen on the display surface 2007, from the first communicator 1002 to the second communicator 2002 (Step S20).

The transmission of the operational information from the first controller 1010 may be started when a part of the remote controller side display information D5 arrives at the edge of the display surface 1016.

In accordance with the fact that the second communicator 2002 receives the command, the second controller 2010 controls the external input/output controller 2012 so as to actuate the browser of the terminal device, carry out the WWW reading operation based on the remote controller side display information D5, and display an image display apparatus side display information D6 composed of a browser screen P, as shown in FIGS. 9(A3), 9(A4) (Step S22).

The operations of the steps S24, S26 are similar to those of the first embodiment.

Furthermore, the first controller 1010 waits for an operational input to select the URL information (remote controller side display information D5) (Step S28).

As mentioned above, according to the third embodiment, even if the manner of the remote controller side display information D5 is the URL information, it is possible to provide the effect similar to that of the first embodiment.

The configuration having the single image display apparatus 20 has been described in the above-mentioned respective embodiments. However, the present invention can be applied to the configuration having a plurality of image display apparatuses 20.

A fourth embodiment having a plurality of image display apparatuses 20 will be described below with reference to FIGS. 1, 10.

FIG. 10 is an explanation view showing the configuration of a remote control system in the fourth embodiment. A remote control system 200 includes a remote controller 10A and two image display apparatuses 20A, 20B.

Only different points of the fourth embodiment from the first to third embodiments will be described below.

A first operation unit 1004 of the remote controller 10A is configured such that the display position of a remote controller side display information D7 displayed on the display surface 1016 of the first displaying unit 1006 can be moved in predetermined directions, namely, a first direction X and a second direction Y that are orthogonal to each other, in this embodiment.

Furthermore, the predetermined directions are associated in advance so as to be different from each other, correspondingly to the respective image display apparatuses 20A, 20B.

Furthermore, a first controller 1010 of the remote controller 10A is configured such that when the display position of the remote controller side display information D7 is moved in the predetermined direction by the first operation unit 1004, the operational information is transmitted to a second communicator 2002 of the image display apparatus 20A or 20B associated with the predetermined direction from the first communicator 1002.

For this reason, by moving the movement direction of the remote controller side display information D7 in the predetermined direction associated with each of the image display apparatuses 20A, 20B, it is possible to selectively perform the remote control on the image display apparatus 20A or 20B. Thus, this is advantageous in improving the usability.

Furthermore, even in the fourth embodiment, it is possible to provide the effect similar to those of the first to third embodiments.

Furthermore, the first operation unit 1004 of the remote controller 10 is not always limited to the device using the touch panel 1018.

It may be configured such that an operational member which can be slid or reclined is placed in a portion of a case 1011 of the remote controller 10, and an operation of the operational member enables the display on the remote controller side to be moved.

In this case, the slid direction and the reclined direction of the operational member are set so as to be coincident with the movement direction of the remote controller side display information displayed on the display surface.

Furthermore, it may be configured such that a switch to be pushed and operated is mounted on the portion of the case 1011 of the remote controller 10, and an operation of the switch enables the display on the remote controller side to be moved.

Furthermore, it may be configured such that a home server (relay unit) is installed for carrying out two-way communication to the first communicator 1002 of the remote controller 10 and also carrying out two-way communication to the second communicator 2002 of the image display apparatus 20, and the communication between the first communicator and the image display apparatus is carried out through the home server.

Moreover, the remote controller side display information displayed on the first operation unit 1004 of the remote controller 10 may be a still image, a moving image, a text data and an icon.

As mentioned above, according to the above-mentioned embodiments, it is possible to provide the visual effect as if the remote controller side display information was physically moved towards the image display apparatus from the first displaying unit of the remote controller so that the image display apparatus was remotely controlled. Hence, this is advantageous in improving easiness of the remote operation by using the remote, controller.

A remote controller, an image display apparatus and a remote control system in another embodiment of the present invention will be described below.

Figure 11:
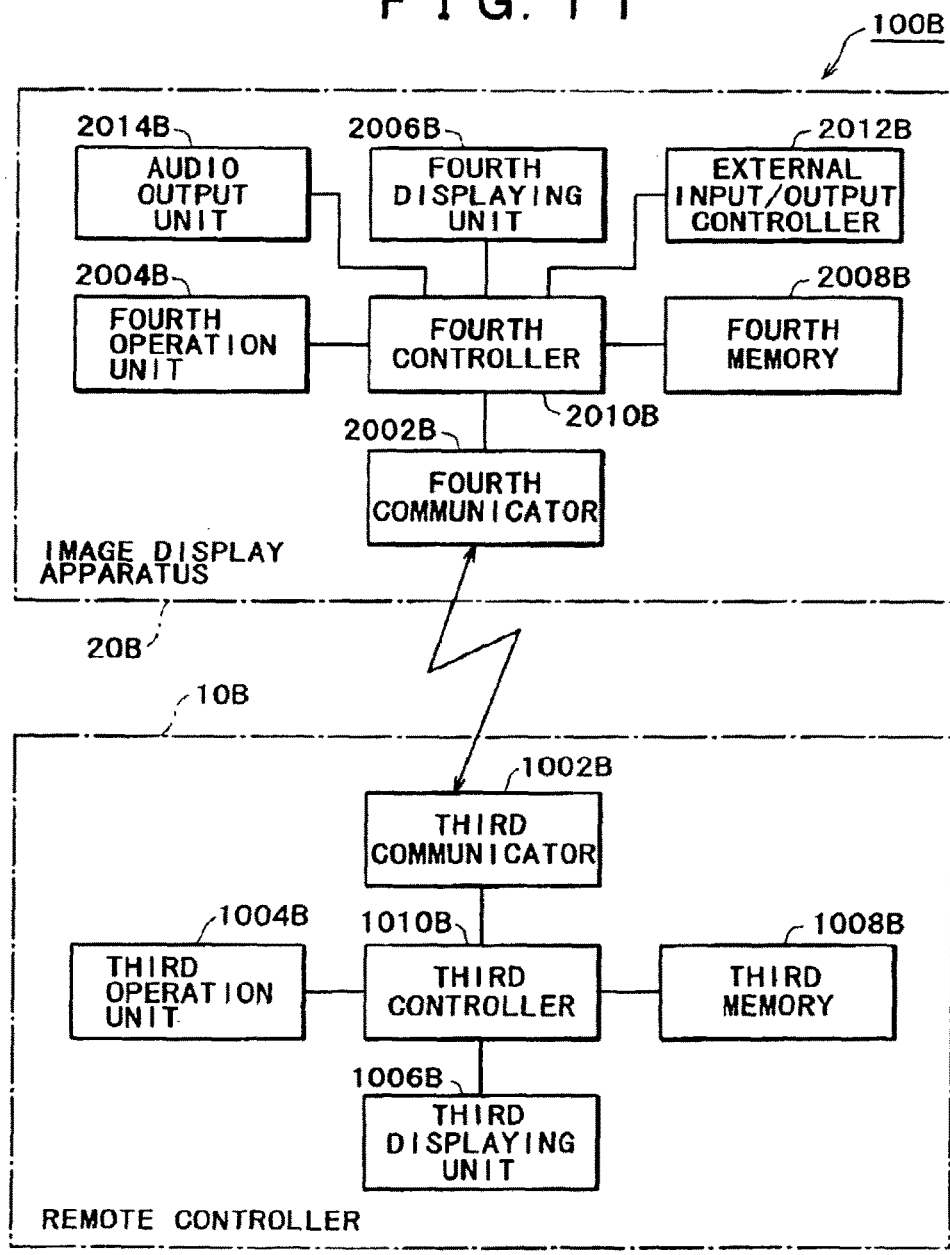
FIG. 11 is a block diagram showing a configuration of a remote control system in another embodiment of the present invention.

FIG. 11 is a block diagram showing a configuration of the remote control system in this embodiment.

A remote control system 100B is provided with a remote controller 10B and an image display apparatus 20B remotely controlled by this remote controller 10B.

The remote controller 10B is provided with a third communicator 1002B, a third operation unit 1004B, a third displaying unit 1006B, a third memory 1008B, a third controller 1010B, and a battery (not shown) constituting a power supply, and the like.

The third communicator 1002B is configured so as to carry out two-way wireless communication to a fourth communicator 2002B of the image display apparatus 20B. This embodiment is described under the assumption that the infrared-ray communication is used as the wireless communication.

This third communicator 1002B is configured so as to receive a remote controller display information which is transmitted from the fourth communicator 2002B of the image display apparatus 20B and will be described later.

The third operation unit 1004B carries out an operation for remotely controlling the image display apparatus 20B, and it is configured so as to generate operational information based on the operation and enter it into the third controller 1010B. The actual configuration of the third operation unit 1004B will be described later.

The third displaying unit 1006B comprises, for example, a liquid crystal display, and it is configured so as to display the remote controller display information. The remote controller display information is used to operate the third operation unit 1004B. Incidentally, the actual configuration of the third displaying unit 1006B will be described later.

The third memory 1008B comprises a ROM region for storing a program carried out by the third controller 1010B, a ROM region for previously storing a second remote controller display information serving as a part of the above-mentioned remote controller display information, and a RAM region that can be written by the third controller 1010B.

The third controller 1010B comprises CPU and configured so as to be operated by carrying out the operational program stored in the third memory 1008B. Then, it controls the third communicator 1002B, the third operation unit 1004B, the third displaying unit 1006B and the third memory 1008B.

Figure 12:
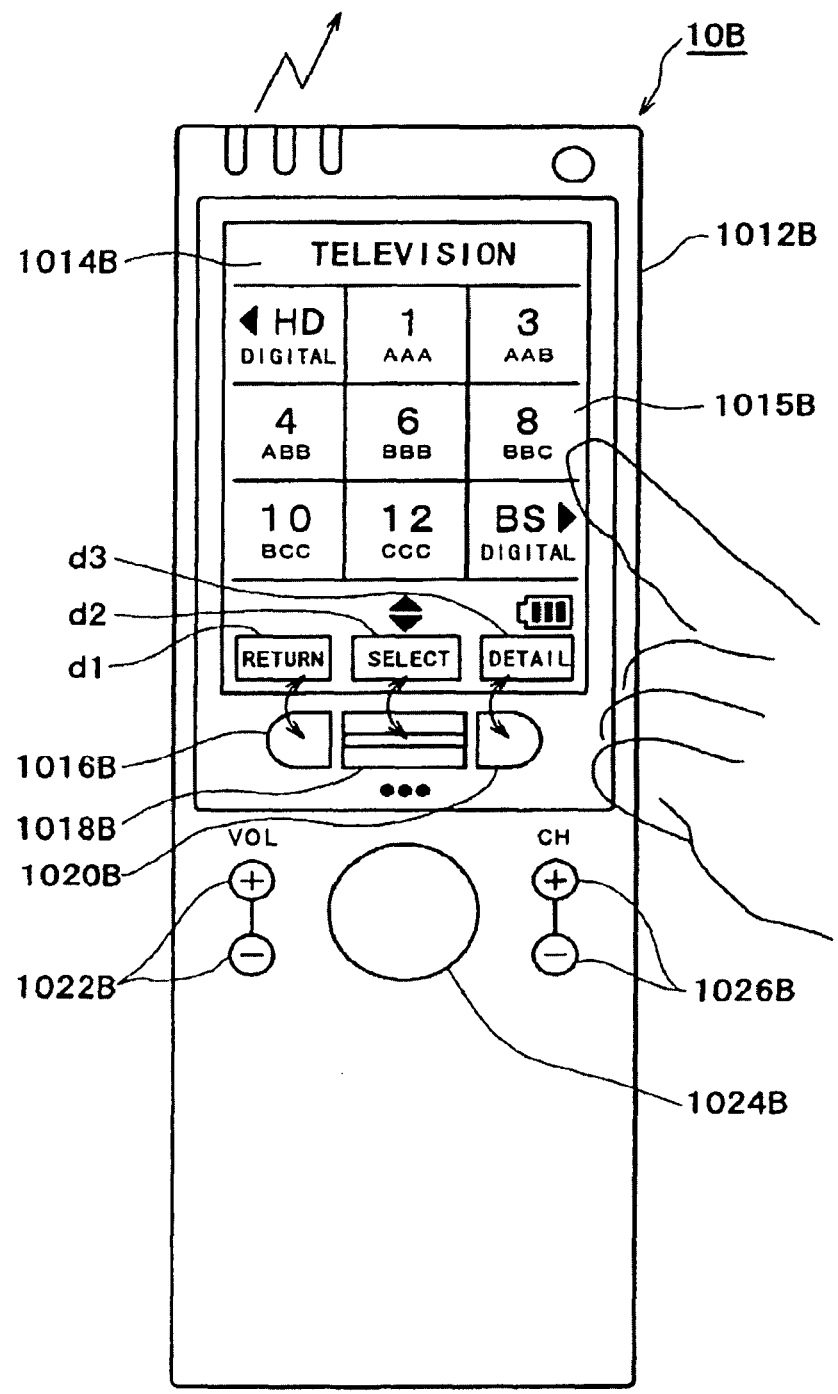
FIG. 12 is a plan view showing a remote controller in another embodiment of the present invention.

As shown in FIG. 12, the remote controller 10B has a case 1012B having a shape of a rectangular plate, which has forward and backward lengths, left and right widths shorter than the lengths and upward and downward thicknesses shorter than the widths.

On a top surface that is one plane in the thickness directions of the case 1012B, a display surface 1014B of the third displaying unit 1006B is placed at a position closer to a front while facing on an external portion. The third displaying unit 1006B is configured such that a character, a figure, a symbol, a still image information and a moving image information can be displayed on the display surface 1014B.

Then, so as to cover the display surface 1014B, a touch panel 1015 having the same shape as the outer shape of the display surface 1014B is placed on the display surface 1014B while overlapping with it. The touch panel 1015 is configured such that the display content of the display surface 1014B can be transparently viewed and it can be operated by a touch of a finger or a touch pen.

On a back portion of the display surface 1014B, a first operation button 1016B, an operational lever 1018B and a second operation button 1020B are straightly arrayed in the width direction.

As shown in FIG. 12, in the portion closer to the rear of the display surface 1014B, operation buttons (d1, d2 and d3) are displayed as a part of the remote controller display information at positions corresponding to positions of the first operation button 1016B, the operational lever 1018B and the second operation button 1020B. The numbers, the shapes and the display contents of those operation buttons are changed on the basis of the remote controller display information.

The first and second operation buttons 1016B, 1020B are operated by a pushing operation. The operational lever 1018B is placed such that it can be slid around an axis line extended in the width direction, and it is always pushed towards a neutral position, and operated by reclining the operational lever 1018B forwardly and backwardly.

Furthermore, in the portion behind the first operation button 1016B, the operational lever 1018B and the second operation button 1020B, a tone volume adjusting button 1022B, a determining button 1024B and a channel selecting button 1026B are arranged in certain intervals in the width direction. The respective buttons are operated by a pushing operation.

The third operation unit 1004B is provided with the touch panel 1015B, the first operation button 1016B, the operational lever 1018B, the second operation button 1020B, the tone volume adjusting button 1022B, the determining button 1024B and the channel selecting button 1026B.

Furthermore, an infrared-ray receiving/emitting device (not shown) constituting the third communicator 1002B is placed at a portion on a front end of the case 1012B. An infrared-ray signal is transmitted (emitted) from this infrared-ray receiving/emitting device, and the infrared-ray signal (the light) is received by the infrared-ray receiving/emitting device.

As shown in FIG. 11, the image display apparatus 20B is provided with a fourth communicator 2002B, a fourth operation unit 2004B, a fourth displaying unit 2006B, a fourth memory 2008B, a fourth controller 2010B, an external input/output controller 2012B and an audio output unit 2014B.

The fourth communicator 2002B is configured so as to carry out two-way wireless communication to the third communicator 1002B. This embodiment is described under the assumption that the infrared-ray communication is used as the wireless communication.

The fourth communicator 2002B is configured so as to transmit to the third communicator 1002B a first remote controller display information constituting a part of the remote controller display information.

The fourth operation unit 2004B is configured so as to directly operate the image display apparatus 20B, and then generate operational information based on the operation and further enter it into the fourth controller 2010B.

The fourth displaying unit 2006B is constituted by, for example, a CRT, a liquid crystal display or a plasma display, and it is configured so as to display the still image information and the moving image information.

The fourth memory 2008B comprises a ROM region for storing a program carried out by the fourth controller 2010B, a ROM region for storing another necessary information and a RAM region that can be written by the fourth controller 2010B.

The external input/output controller 2012B interfaces a reception or an output of a signal from or to an external apparatus and selects an input signal (content). As the external apparatus connected to the external input/output controller 2012B, for example, there are various AV apparatuses, namely, a television tuner, a video recorder, a video camera, a radio, a personal computer and the like.

Thus, the external input/output controller 2012B receives an image signal and an audio signal of a television broadcast, an image signal and an audio signal from a video recorder or a video camera, and an audio signal from a radio.

Furthermore, the external input/output controller 2012B has a function of transmitting and receiving a data signal and a control signal to and from a personal computer.

Furthermore, the external input/output controller 2012B may be connected to the Internet through a network such as LAN and the like. In this case, it is necessary that the external input/output controller 2012 is configured as a terminal apparatus having a communicating function.

The external input/output controller 2012B is configured so as to select those signals in accordance with the control of the fourth controller 2010B, and enter into the fourth displaying unit 2006B and the audio output unit 2014B or output a necessary signal.

The audio output unit 2014B comprises a speaker and an amplifier (which are not shown) and the like, and it is configured so as to make the audio signal from an input audio signal and output it.

The fourth controller 2010B comprises CPU and configured so as to be operated by carrying out the operational program stored in the fourth memory 2008B. Then, it controls the fourth communicator 2002B, the fourth operation unit 2004B, the fourth displaying unit 2006B, the fourth memory 2008B, the external input/output controller 2012B and the audio output unit 2014B. Furthermore, it generates the remote controller display information to be transmitted to the remote controller 10B.

Figure 13:
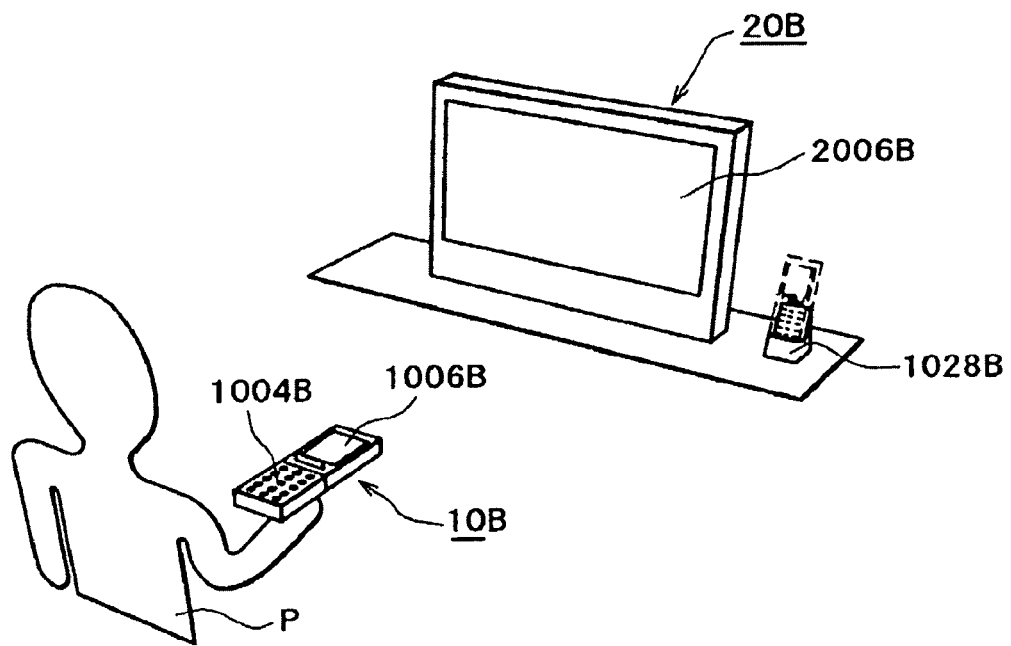
FIG. 13 is an explanation view showing a usage state of the remote control system in another embodiment of the present invention.

FIG. 13 is an explanation view showing a usage state of the remote control system 100B.

As shown in FIG. 13, a user P located at a position away from the image display apparatus 20B operates the operation unit 1004B of the remote controller 10B, and carries out the two-way communication between the third communicator 1002B and the fourth communicator 2002B of the image display apparatus 20B, and remotely controls the image display apparatus 20B.

Furthermore, a charging device 1028B is placed in the vicinity of the image display apparatus 20B. It is configured such that the battery is charged by installing the remote controller 10B in this charging device 1028B.

The operation for using the remote control system 100B and remotely operating the image display apparatus 20B will be described below with reference to a flowchart of FIG. 16. Here, it is assumed that the remote controller 10B and the image display apparatus 20B are at stand-by mode at first.

Figure 14A:
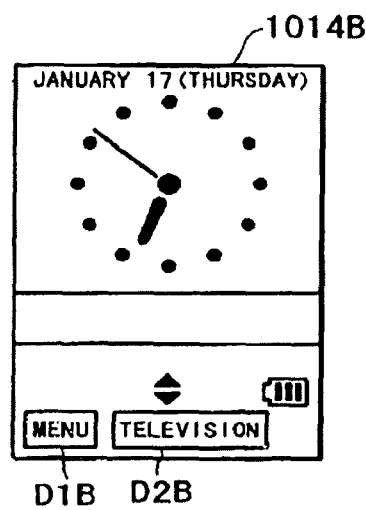
FIG. 14A is an explanation view showing a stand-by screen of the remote controller.

As shown in FIG. 14A, the remote controller 10B indicates a stand-by screen at stand-by mode (Step S10B).

That is, the display surface 1014B displays thereon a character information indicative of a year, a month and a day, and an image information indicative of a current time by a combination of a long needle and a short needle, and Furthermore displays thereon a menu button D1B to request a menu display and a television button D2B to request a television image display, as the remote controller display information to operate the remote controller 10B.

The menu button D1B and the television button D2B are a second remote controller display information stored in the third memory 1008B, and they are the information used to operate the third operation unit 1004B.

Here, when a user P operates the first operation button 1016B corresponding to the menu button D1, the stand-by mode ends to then display a main menu (Step S12B).

Figure 14B:
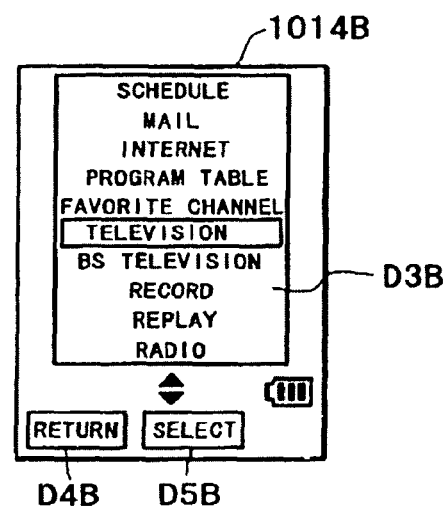
FIG. 14B is an explanation view showing a main menu display screen of the remote controller.

That is, as shown in FIG. 14B, a menu list D3B for listing the contents displayed on the image display apparatus 20B and the functions of the image display apparatus 20B, a return button D4B to return a display content to a display one display earlier, and a selection button D5 to select the menu D3B are displayed on the display surface 1014B.

The menu button D3B, the return button D4B and the selection button D5B are the second remote controller display information previously stored in the third memory 1008B, and it is the information used to operate the third operation unit 1004B.

Then, the user P reclines the operational lever 1018B corresponding to a selection button D5B forwardly and backwardly, moves a cursor displayed on the menu D3B to a position of a desired function, and then operates the determining button 1024B at that state, and thereby determines the selected function. Thus, a low order menu is displayed (Step S14B).

Figure 14C:
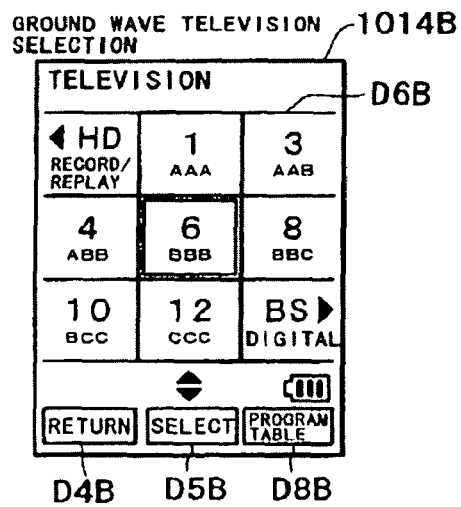
FIG. 14C is an explanation view showing a low order menu display screen.
Figure 14D:
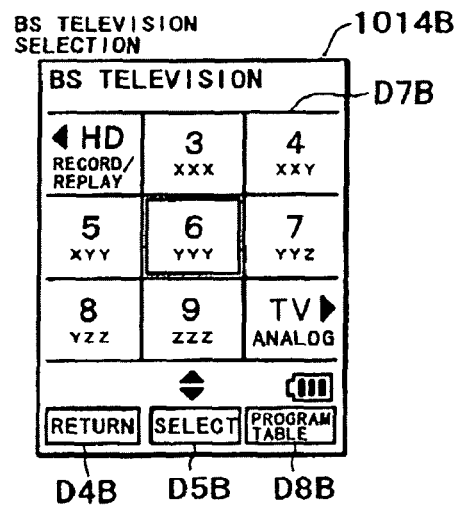
FIG. 14D is an explanation view showing another low order menu display screen.

When a ground wave television or a BS television is selected and determined, the screen (function screen) indicative of television station names (channels) D6B, D7B, and a program table button D8B is displayed on the display surface 1014B, as shown in FIGS. 14C, 14D (Step S16).

Each ground wave television station name (channels) D6B, each BS television station name (channel) D7B and the program table button D8B as mentioned above are the second remote controller display information previously stored in the third memory 1008B, and it is the information used to operate the third operation unit 1004B.

Figure 15A:
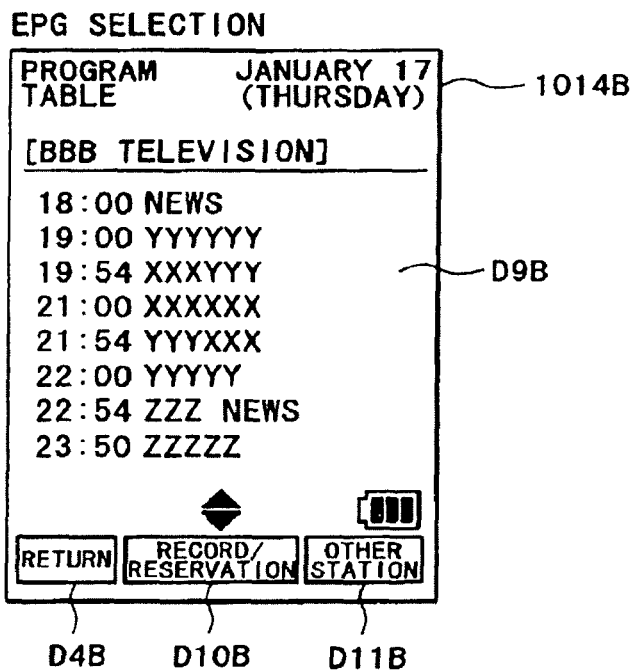
FIG. 15A is an explanation view showing a display screen for displaying a program table.

Here, when the second operation button 1020B corresponding to the program table button D8B is operated to select and determine a function, the return button D4B, a program table D9B, a recording/reserving button D10B and a different station button D11B to request a program table of a different station are displayed as shown in FIG. 15A.

That is, the third controller 1010B of the remote controller 10B transmits the operational information requesting the program table D9B through the third communicator 1002B to the image display apparatus 20B (Step S18).

When the fourth communicator 2002B receives the operational information, the fourth controller 2010B of the image display apparatus 20B generates the program table D9B from EPG, which the external input/output controller 2012B receives from a television station, and transmits this program table D9B as the first remote controller display information through the fourth communicator 2002B to the third communicator 1002B. Thus, the third communicator 1002B receives the program table D9B (Step S20B).

The third controller 1010B controls to display the return button D4B, the recording/reserving button D10B and the different station button D11B together with the program table D9B received by the third communicator 1002B, on the display surface 1014B of the third displaying unit 1006B, and then displays a functional screen (Step S22B).

Thus, the third display 1006B displays thereon the program table D9B serving as the first remote controller display information, the return button D4B serving as the second remote controller display information previously stored in the third memory 1008B, the recording/reserving button D10B and the different station button D11B.

Figure 15B:
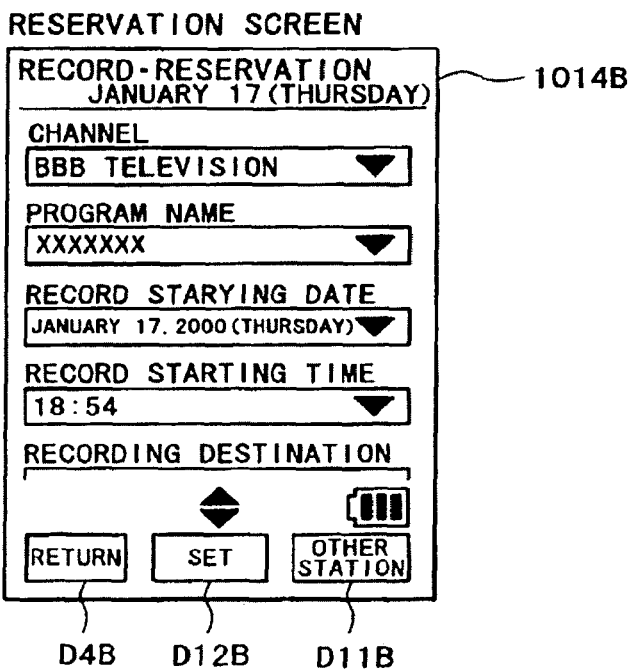
FIG. 15B is an explanation view showing a display screen of a recording reservation.

Here, when the recording/reserving button D10B is operated, a reservation screen is displayed for selecting and entering a channel, a program name, a year, month, day and time in a start of a recording operation, a record destination and the like, as shown in FIG. 15B (Step S24B). Furthermore, the return button D4B, a determining button 12B and the different station button D11B are displayed.

On the reservation screen, the channel, the program name, the year, month, day and time in the start of the recording operation, and the record destination are set by using the third operation unit 1004B. This setting is done by using the information of the program table and then operating the operational lever 1018B or the determining button 1024B.

Accordingly, the operational information generated by the third operation unit 1004B is transmitted to the image display apparatus 20B. The fourth controller 2010B carries out the reservation recording setting of a tuner or a video recorder, in accordance with the received operational information (Step S26B).

The operation of the reservation recording setting is ended as mentioned above.

Furthermore, FIGS. 17A, 17B and 17C show the screen examples displayed on the display surface 1014B of the remote controller 10B when WWW is read after the Internet is selected on the menu screen of FIG. 14B.

FIG. 17A shows a URL (Uniform Resource Locator) D11B, a scroll button D12B to move a display area displayed on the fourth displaying unit 2006B of the image display apparatus 20B, a return button D13B, a menu button D14B and a previous page button D15B, as the remote controller display information.

FIG. 17B shows a URL D11B, a scroll button D12B, a page movement button D16B, a home page button D17B, a book mark button D18B, a return button D13B, a scroll button D19B and a cut button D20B for indicating a communication cut, as the remote controller display information.

FIG. 17C shows the URL D11B, the page movement button D16B, the home page button D17B, the book mark button D18B, a cursor D21B, the return button D13B, the scroll button D19B and the cut button D20B for indicating the communication cut, as the remote controller display information.

The cursor D21B is the cursor serving as an index to move the cursor displayed on the fourth displaying unit 2006B of the image display apparatus 20B by operating the touch panel 1015B with the touch pen.

When the WWW of the Internet is read, it is operated by displaying those screens shown in FIGS. 17A, 17B and 17C.

Those information D11B to D21B are the second remote controller display information previously stored in the third memory 1008B, and they are the information used to operate the third operation unit 1004B.

Furthermore, FIG. 18A shows the screen example displayed on the display surface 1014B of the remote controller 10B when the recorded content is read, after the video recorder or the video camera is selected, on the menu screen of FIG. 14B.

In FIG. 18A, a reproducing button D22B, a rewinding button D23B, a fast feeding button D24B, a backward head-search button D25B, a forward head-search button D26B, a stop button D27B, a content (program name) title D28B, a reproduction elapse time D29B, a return button D30B to return a display content to a display one display earlier, a selecting button D31B for selecting a content and the like, a detail display button D32B for displaying a detail of a content, a recordable remaining time D33B and the like are displayed as the remote controller display information on the display surface 1014B.

When a reproduction image (moving image) of the video recorder is enjoyed, the screen shown in FIG. 18A is displayed and operated.

Those information D22B to D34B are the second remote controller display information previously stored in the third memory 1008B, and they are the information used to operate the third operation unit 1004B.

Furthermore, FIG. 18B shows the screen example displayed on the display surface 1014B of the remote controller 10B when the recorded content is read, after the video camera is selected, on the menu screen of FIG. 14B.

In FIG. 18B, similarly to FIG. 18A, the reproducing button D22B, the rewinding button D23B, the fast feeding button D24B, the backward heading button D25B, the forward heading button D26B, the stop button D27B, the reproduction elapse time D29B, the return button D30B, the selecting button D31B, the detail display button D33, the recordable remaining time D34B and the like are displayed on the display surface 1014B.

When a reproduction image (moving image) of the video camera is enjoyed, the screen shown in FIG. 18B is displayed and operated.

Those information D22B to D34B are the second remote controller display information previously stored in the third memory 1008B, and they are the information used to operate the third operation unit 1004B.

As mentioned above, according to the remote controller 10B, the image display apparatus 20B and the remote control system 100B in this embodiment, it is possible to use the first remote controller display information transmitted to the third communicator 1002B from the image display apparatus 20B as the remote controller display information displayed on the third displaying unit 1006B of the remote controller 10B.

Thus, the remote controller display information to operate the third operation unit 1004B of the remote controller 10B can be associated with the content displayed by the image display apparatus 20B and the function of the image display apparatus 20B. Hence, this is advantageous in improving easiness of use.

This embodiment is described by exemplifying the case in which the first and second operation buttons 1016B, 1020B and the operational lever 1018B are used as the third operation unit 1004B. However, the touch panel 1015B may be used.

Furthermore, it may be configured such that a home server (relay unit) is installed for carrying out two-way communication to the third communicator 1002B of the remote controller 10B and also carrying out two-way communication to the fourth communicator 2002B of the image display apparatus 20B, and the communication between the third communicator and the image display is carried out through the home server.

Furthermore, the remote controller display information displayed on the third displaying unit 1004B of the remote controller 10B is not limited to this embodiment, and it may be the image information of the still image and the moving image.

Furthermore, the first remote controller display information and the operational information are not limited to this embodiment.

For example, they can be configured as follows. That is, a character broadcast as the first remote controller display information and the like are transmitted from the image display apparatus 20B to the remote controller 10B and displayed at any time. Then, when the user selectively operates the keyword portion of the displayed character broadcast by using the third operation unit 1004B, the operational information indicative of the keyword is transmitted from the remote controller 10B to the image display apparatus 20B. Accordingly, a television program in relation to the selected keyword is displayed in accordance with the operational information received by the image display apparatus 20B.

Alternatively, they can be also configured as follows. That is, URL associated with a content of a television program is transmitted from the image display apparatus 20B to the remote controller 10B and displayed as the first remote controller display information. Then, when a user selectively operates the displayed URL by using the third operation unit 1004B, the operational information indicative of that URL is transmitted from the remote controller 10B to the image display apparatus 20B. Accordingly, a site of the selected URL is displayed in accordance with the operational information received by the image display apparatus 20B.

Furthermore, they may be configured as follows. That is, the keyword or the URL is once stored in the third memory 1008B of the remote controller 10B. As necessary, it is again displayed on the third displaying unit 1006B, and the selective operation is carried out by the third operation unit 1004B.

As mentioned above, according to the present invention, the first remote controller display information transmitted to the remote controller from the image display apparatus is used as the remote controller display information displayed on the remote controller. Thus, the remote controller display information to operate the remote controller can be associated with the content displayed by the image display apparatus and the function of the image display apparatus. Hence, this is advantageous in improving easiness of use.

Although the present invention has been described in its preferred form with a certain degree of particularity, obviously many changes, combinations and variations are possible therein. It is therefore to be understood that the present invention may be practiced otherwise than as specifically described herein without departing from the scope of the present invention.

What is claimed is:

1. An information processing apparatus, comprising:
a circuitry configured to:
initiate a communicating of information related to a content that was previously displayed on a first display screen; and
initiate an execution of a process for controlling a displaying of the content on the first display screen as a result of a user input operation upon a displayed object, the displayed object being based on the information and displayed on a second display screen which is provided separately from the first display screen,
wherein the content is not being displayed on the first display screen at a time when the user input operation is performed.

2. The information processing apparatus according to claim 1, wherein the second display screen is a touch sensitive display and the user input operation is a touch gesture operation upon the touch sensitive display.

3. The information processing apparatus according to claim 2, wherein the touch gesture operation is a drag operation on the touch sensitive display.

4. The information processing apparatus according to claim 3, wherein the displayed object is moved in response to the drag operation.

5. The information processing apparatus according to claim 4, wherein the information processing apparatus selects a device within which the first display screen is included for displaying the content in response to moving of the drag operation.

6. The information processing apparatus according to claim 3, wherein the content is controlled to be displayed on the first display screen as a result of the displayed object having been moved.

7. The information processing apparatus according to claim 1, wherein the process for controlling the displaying of the content comprises an issuing of a command for starting to display the content on the first display screen.

8. The information processing apparatus according to claim 1, wherein the information is communicated through wireless communication.

9. The information processing apparatus according to claim 1, wherein the content is not being displayed on the first display screen at a time when the information is communicated.

10. The information processing apparatus according to claim 1, wherein the circuitry is further configured to control a vibration generator in response to the user input operation.

11. The information processing apparatus according to claim 1, wherein communication between the information processing apparatus and the first display screen is performed through a server which is connected with the information processing apparatus through wireless communication.

12. The information processing apparatus according to claim 1, wherein the circuitry is further configured to cause a displaying of the displayed object on the second display screen.

13. The information processing apparatus according to claim 12, wherein the information processing apparatus further comprising the second display screen.

14. The information processing apparatus according to claim 13, wherein the information processing apparatus further comprises:
a wireless communication unit configured to perform the wireless communications;
a vibration generator;
a speaker; and
a rechargeable battery,
wherein, a touch sensor is provided on the second display screen.

15. The information processing apparatus according to claim 1, wherein the first display screen is provided separately from the information processing apparatus.

16. The information processing apparatus according to claim 1, wherein the first display screen is provided on the information processing apparatus.

17. The information processing apparatus according to claim 1, wherein the content is a broadcast channel.

18. The information processing apparatus according to claim 1, wherein the information processing apparatus is configured to connect to the Internet.

19. The information processing apparatus according to claim 1, wherein the content that was previously displayed on the first display screen is a first portion of a video content, and the content that is controlled to be displayed on the first display screen as a result of the user input operation upon the displayed object is a second portion of the video content, the first portion of the video content being different than the second portion of the video content.

20. The information processing apparatus according to claim 19, wherein the video content is a broadcasted media.

21. An information processing method implemented by a processor of an information processing apparatus, the method comprising:
communicating information related to a content that was previously displayed on a first display screen; and
executing a process for controlling a displaying of the content on the first display screen as a result of a user input operation upon a displayed object, the displayed object being based on the information and displayed on a second display screen which is provided separately from the first display screen,
wherein the content is not being displayed on the first display screen at a time when the user input operation is performed.

22. A non-transitory computer-readable medium having embodied thereon a program, which when executed by a computer causes the computer to perform an information processing method, the method comprising:
communicating information related to a content that was previously displayed on a first display screen; and
executing a process for controlling a displaying of the content on the first display screen as a result of a user input operation upon a displayed object, the displayed object being based on the information and displayed on a second display screen which is provided separately from the first display screen,
wherein the content is not being displayed on the first display screen at a time when the user input operation is performed.

* * * * *